United States Patent
Collins et al.

(10) Patent No.: US 8,008,748 B2
(45) Date of Patent: Aug. 30, 2011

(54) DEEP TRENCH VARACTORS

(75) Inventors: David S. Collins, Williston, VT (US);
Robert M. Rassel, Colchester, VT (US);
Eric Thompson, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 307 days.

(21) Appl. No.: 12/342,609

(22) Filed: Dec. 23, 2008

(65) Prior Publication Data
US 2010/0155897 A1    Jun. 24, 2010

(51) Int. Cl.
*H01L 29/93* (2006.01)

(52) U.S. Cl. ........ 257/600; 257/314; 257/371; 257/315; 257/316; 257/318; 257/319; 257/320; 257/369; 257/327; 257/329; 257/330; 257/301; 257/532; 257/E29.325; 257/E21.003; 438/243; 438/386

(58) Field of Classification Search .......... 257/600, 257/379, E29.325, 314, 371, 315, 316, 318, 257/319, 320, 369, 327, 330, 301, 532; 438/E21.003, 243, 386
See application file for complete search history.

(56) References Cited

U.S. PATENT DOCUMENTS

| | | | |
|---|---|---|---|
| 5,394,000 A | 2/1995 | Ellul et al. | |
| 6,172,378 B1 | 1/2001 | Hull et al. | |
| 6,452,224 B1 | 9/2002 | Mandelman et al. | |
| 6,653,716 B1 | 11/2003 | Vashchenko et al. | |
| 6,825,546 B1 | 11/2004 | Walker et al. | |
| 6,870,212 B2* | 3/2005 | Chang et al. | 257/314 |
| 7,129,801 B2 | 10/2006 | Wu | |
| 2003/0030091 A1* | 2/2003 | Bulsara et al. | 257/301 |
| 2005/0045888 A1 | 3/2005 | Kadowaki et al. | |
| 2005/0212048 A1 | 9/2005 | Litwin | |
| 2006/0006459 A1* | 1/2006 | Yoshikawa | 257/330 |
| 2006/0189057 A1* | 8/2006 | Delpech et al. | 438/197 |
| 2007/0215953 A1* | 9/2007 | Voldman | 257/372 |
| 2007/0272961 A1 | 11/2007 | Aitken et al. | |
| 2008/0116529 A1 | 5/2008 | Cannon et al. | |
| 2008/0135933 A1* | 6/2008 | Miller et al. | 257/339 |
| 2008/0191314 A1 | 8/2008 | Aitken et al. | |
| 2008/0265333 A1 | 10/2008 | Collins et al. | |

OTHER PUBLICATIONS

International Search Report dated Feb. 23, 2010.

* cited by examiner

*Primary Examiner* — Marcos D Pizarro
*Assistant Examiner* — Marc Armand
(74) *Attorney, Agent, or Firm* — Scully, Scott, Murphy & Presser, P.C.; Richard M. Kotulak, Esq.

(57) ABSTRACT

A deep trench varactor structure compatible with a deep trench capacitor structure and methods of manufacturing the same are provided. A buried plate layer is formed on a second deep trench, while the first trench is protected from formation of any buried plate layer. The inside of the deep trenches is filled with a conductive material to form inner electrodes. At least one doped well is formed outside and abutting portions of the first deep trench and constitutes at least one outer varactor electrode. Multiple doped wells may be connected in parallel to provide a varactor having complex voltage dependency of capacitance. The buried plate layer and another doped well connected thereto constitute an outer electrode of a linear capacitor formed on the second deep trench.

29 Claims, 16 Drawing Sheets

DEEP TRENCH VARACTORS

FIELD OF THE INVENTION

The present invention relates to a semiconductor structure, and particularly to deep trench varactors compatible with deep trench linear capacitors and methods of manufacturing the same.

BACKGROUND OF THE INVENTION

A varactor is a semiconductor device having a voltage-sensitive capacitance. Frequently, the space-charge region and the accumulation at the surface of a semiconductor contacting an insulator are altered as a function of applied voltage to produce a bias-dependent capacitance.

The variability of the capacitance in a varactor may be advantageously employed in various electronic circuits to provide useful functions in amplifiers, oscillators, and frequency synthesizers. For example, varactors may be used to construct voltage-controlled oscillators (VCO), which generates a tunable stable frequency without employing a circuit with multiple oscillators. U.S. Pat. No. 7,129,801 to Wu shows an exemplary use of a varactor in a VCO circuit. A VCO is a versatile basic building block for constructing transceiver circuitry, phase locked loop (PLL) circuitry, and other wireless communication circuitry.

Metal oxide semiconductor (MOS) varactors employing a planar configuration are known in the art. Such prior MOS varactors typically employ the same dielectric material as the gate dielectric for the node dielectric separating a first overlying electrode from a second underlying electrode. With the scaling of the gate dielectric in semiconductor technology, however, performance of such MOS varactors is negatively impacted by leakage current through the node dielectric, which has the same thickness as the gate dielectric since both are formed at the same processing step and have identical composition and thickness. While use of a thicker dielectric layer for the node dielectric could reduce leakage current through the prior art varactors, such changes will accompany degradation of device performance for field effect transistors that have a gate dielectric with a correspondingly increased thickness. Further, such an approach negatively impacts the tunability of a varactor by decreasing the maximum capacitance in an accumulation mode.

While deep trench capacitors employing a separate thicker node dielectric with minimal leakage current and high areal capacitance density are also known in the art, such deep trench capacitors are linear capacitors having a constant capacitance, and do not provide any variability in capacitance.

In view of the above, there exists a need for a semiconductor varactor that provides high areal capacitance density and minimal leakage current as well as variability in capacitance, and methods of manufacturing the same.

Further, many semiconductor circuits require varactors as well as linear capacitors. Therefore, there exists a need for a semiconductor structure including such a semiconductor varactor as well as a linear capacitor having high areal capacitance density and minimal leakage current in the same semiconductor chip.

SUMMARY OF THE INVENTION

The present invention addresses the needs described above by providing a semiconductor structure comprising a deep trench varactor having high areal capacitance density and minimal leakage current and optionally including a linear deep trench capacitor, and methods of manufacturing the same.

According to the present invention, a first deep trench and an optional second deep trench are formed in a semiconductor substrate. A buried plate layer is formed outside the sidewalls of the optional second deep trench, if present, while sidewalls of the first deep trench are protected from introduction of dopants to prevent formation of any buried plate layer on the first deep trench. The inside of the first trench is filled with a conductive material to form an varactor inner electrode. A first doped well extending from a top surface of the semiconductor substrate to a first depth less than the depth of the first deep trench is formed outside and abutting an upper portion of the first deep trench to constitute an outer varactor electrode. The inside of the second trench is filled with the conductive material to form a capacitor inner electrode of a linear capacitor. Another first doped well and the buried plate layer connected thereto collectively constitute an outer capacitor electrode of the linear capacitor.

A second doped well having an opposite conductivity type as the first doped well may be formed underneath the first doped well around the first deep trench. The second doped well constitutes a secondary varactor outer electrode that may be connected to the varactor outer electrode. Additional doped wells may be formed underneath the second doped well to form additional varactor outer electrodes that may be connected to the varactor outer electrode. The doping concentration and the dopant type of the various wells may be adjusted to form component varactors having different voltage-dependent capacitance characteristics. By a parallel connection of the multiple component varactors provides a varactor having a complex voltage dependency of capacitance on the voltage between the varactor inner electrode and the outer varactor electrodes. In addition to the varactor formed in the first deep trench, the deep trench capacitor in the second trench provides linear response in capacitance to applied voltage differential, i.e., a constant capacitance.

According to an aspect of the present invention, a semiconductor structure is provided, which comprises:

a deep trench located in a semiconductor substrate and having a bottom surface located at a first depth from a top surface of the semiconductor substrate;

a node dielectric abutting sidewalls and the bottom surface of the deep trench;

a conductive inner electrode located inside the node dielectric;

a doped well extending from the top surface of the semiconductor substrate to a second depth, located outside the deep trench, and abutting and laterally enclosing the node dielectric, wherein the second depth is less than the first depth; and a semiconductor region having a different dopant concentration or a doping of a different conductivity type than the doped well, located in the semiconductor substrate, and abutting and laterally enclosing an entirety of a lower portion of the deep trench beneath a depth from the top surface of the semiconductor substrate, wherein the depth is less than the first depth.

In one embodiment, the semiconductor structure further comprises a second doped well located in the semiconductor substrate and extending from the second depth to a third depth, wherein the second doped well is located outside the deep trench and abuts and laterally encloses the node dielectric, wherein the third depth is greater than the second depth and is less than the first depth.

In another embodiment, the semiconductor structure further comprises a third doped well located in the semiconductor substrate and extending from the third depth to a fourth depth, wherein the third doped well is located outside the deep trench and abuts and laterally encloses the node dielectric, wherein the fourth depth is greater than the third depth and is less than the first depth.

According to another aspect of the present invention, another semiconductor structure is provided, which comprises:

a first deep trench located in a semiconductor substrate and having a bottom surface located at a first depth from a top surface of the semiconductor substrate;

a first node dielectric abutting sidewalls and the bottom surface of the first deep trench;

a first conductive inner electrode located inside the first node dielectric;

a doped well extending from the top surface of the semiconductor substrate to a second depth, located outside the first deep trench, and abutting and laterally enclosing the first node dielectric, wherein the second depth is less than the first depth;

a semiconductor region having a different dopant concentration or a doping of a different conductivity type than the doped well, located in the semiconductor substrate, and abutting and laterally enclosing an entirety of a lower portion of the first deep trench beneath a depth from the top surface of the semiconductor substrate, wherein the depth is less than the first depth;

a second deep trench located in the semiconductor substrate and having a bottom surface located at the first depth;

a second node dielectric abutting sidewalls and the bottom surface of the second deep trench;

a second conductive inner electrode located inside the second node dielectric; and a buried plate layer located underneath and outside the second node dielectric and laterally enclosing and laterally abutting the second node dielectric and abutting a bottom surface of the second node dielectric at the first depth.

According to yet another aspect of the present invention, a method of forming a semiconductor structure is provided, which comprises:

providing a semiconductor substrate comprising a semiconductor region having a doping of a first conductivity type;

forming a deep trench extending from a top surface of the semiconductor substrate to a first depth in the semiconductor region;

forming a node dielectric on sidewalls and a bottom surface of the deep trench, wherein an entirety of surfaces of the deep trench has a doping of the first conductivity type;

forming a conductive inner electrode inside the node dielectric; and forming a doped well extending from the top surface of the semiconductor substrate to a second depth outside the deep trench by conversion of an upper portion of the semiconductor region through introduction of dopants into the upper portion of the semiconductor region, wherein the doped well abuts and laterally encloses the node dielectric, and wherein the second depth is less than the first depth.

A remaining portion of the semiconductor region after formation of the doped well may abut the doped well at the second depth.

In one embodiment, the method may further comprise forming a second doped well in the semiconductor region by implantation of dopants, wherein the second doped well extends from the second depth to a third depth, wherein the second doped well is located outside the deep trench and abuts and laterally encloses the node dielectric, wherein the third depth is greater than the second depth and is less than the first depth.

A remaining portion of the semiconductor region after formation of the second doped well may abut the second doped well at the third depth.

The second doped well and the doped well may have different dopant concentrations or different doping conductivity types. The second doped well may have a doping of the first conductivity type and the doped well may have a doping of the second conductivity type. Alternately, the second doped well may have a doping of the second conductivity type and the doped well may have a doping of the first conductivity type.

The method may further comprise:

forming a first contact via directly on a top surface of the conductive inner electrode;

forming a second contact via directly on the doped well;

forming a conductive reachthrough region extending from the top surface of the semiconductor substrate to the second doped well;

forming a third contact via directly on the conductive reachthrough region;

forming another conductive reachthrough region extending from the top surface of the semiconductor substrate to the third doped well; and forming a fourth contact via directly on the another conductive reachthrough region, wherein the fourth contact via, the third contact via, and the second via are electrically shorted by a metal interconnect structure.

In another embodiment, the method further comprises forming a second doped well in the semiconductor region by implantation of dopants, wherein the second doped well extends from the second depth to a third depth, and the second doped well is located outside the deep trench and abuts and laterally encloses the node dielectric, and the third depth is greater than the second depth and is less than the first depth.

In even another embodiment, the second doped well and the doped well have different dopant concentrations or different doping conductivity types.

In yet another embodiment, the method further comprises:

forming a first contact via directly on a top surface of the conductive inner electrode;

forming a second contact via directly on the doped well;

forming a conductive reachthrough region extending from the top surface of the semiconductor substrate to the second doped well; and forming a third contact via vertically abutting the conductive reachthrough region; wherein the third contact via and the second via are electrically shorted by a metal interconnect structure.

In still another embodiment, the method further comprises forming a third doped well in the semiconductor substrate, wherein the third doped well extends from the third depth to a fourth depth, wherein the third doped well is located outside the deep trench and abuts and laterally encloses the node dielectric, wherein the fourth depth is greater than the third depth and is less than the first depth, wherein the third doped well has a different dopant concentration or a different doping conductivity type than the second doped well, and wherein third doped well has a different dopant concentration or a different doping conductivity type than the doped well.

According to still another aspect of the present invention, another method of forming a semiconductor structure is provided, which comprises:

providing a semiconductor substrate comprising a semiconductor region having a doping of a first conductivity type;

forming a first deep trench and a second deep trench, each extending from a top surface of the semiconductor substrate to a first depth in the semiconductor region;

forming a buried plate layer having a doping of a second conductivity type on sidewalls of the second deep trench, while an entirety of sidewalls of the first trench is protected from introduction of any dopants of the second conductivity type, wherein the second conductivity type is the opposite of the first conductivity type;

forming a first node dielectric on sidewalls and a bottom surface of the first deep trench, wherein an entirety of surfaces of the first deep trench has a doping of the first conductivity type; and forming a first conductive inner electrode inside the first node dielectric.

DETAILED DESCRIPTION OF THE INVENTION

Figure 1:
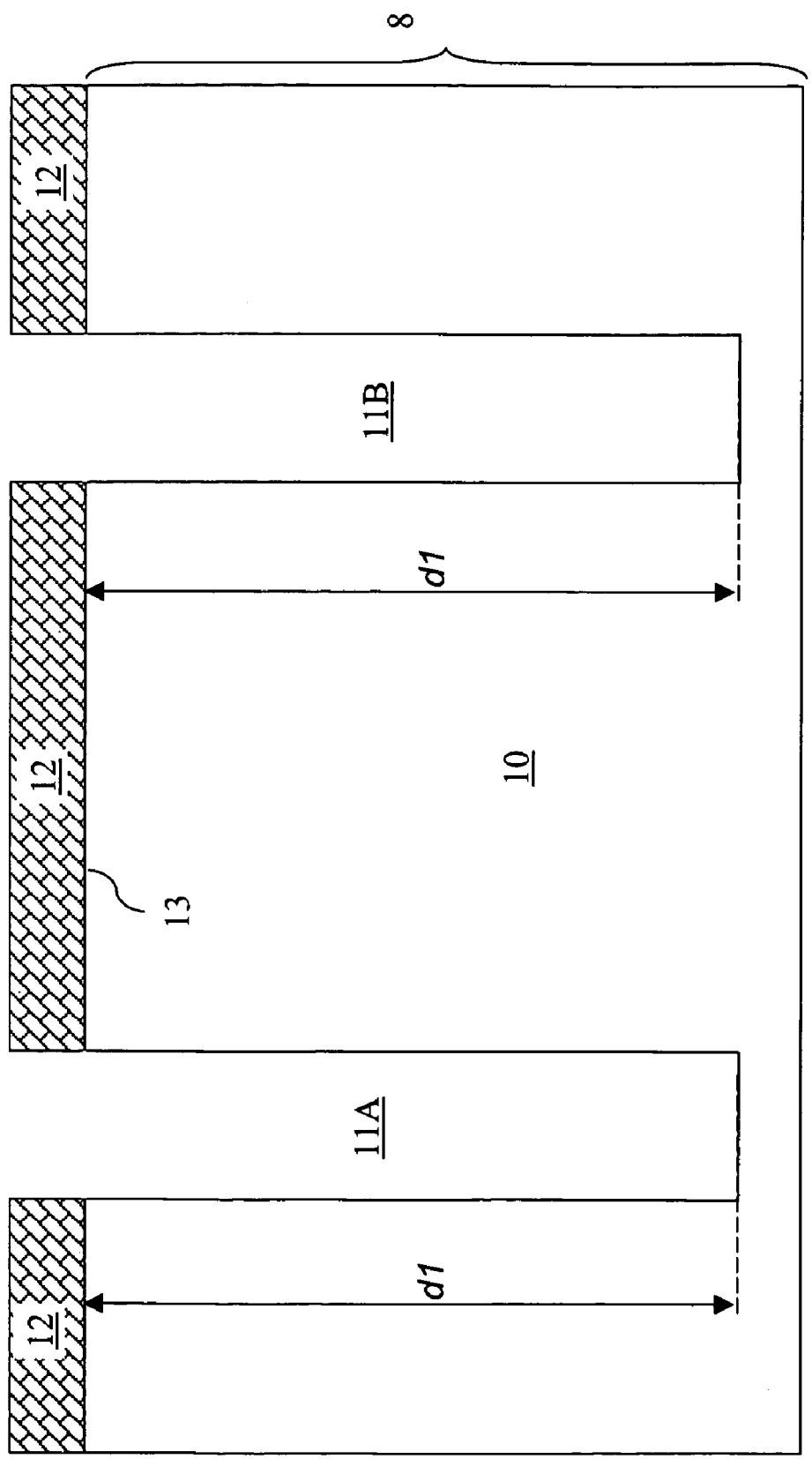
FIG. 1 is a vertical cross-sectional view of a first exemplary semiconductor structure after formation a first deep trench 11A and a second deep trench 11B according to a first embodiment of the present invention.

As stated above, the present invention relates to deep trench varactors compatible with deep trench linear capacitors and methods of manufacturing the same, which are now described in detail with accompanying figures. It is noted that like reference numerals refer to like elements across different embodiments.

Referring to FIG. 1, a first exemplary semiconductor structure according to a first embodiment of the present invention comprises a semiconductor substrate 8 containing a semiconductor region 10, a first deep trench 11A, and a second deep trench 11B. Preferably, the semiconductor region 10 comprises a single crystalline semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. Preferably, the semiconductor substrate 8 is a single crystalline substrate in which the entirety of the semiconductor region 10 is epitaxially aligned single crystalline material. The semiconductor substrate 8 may be a bulk substrate or a hybrid substrate including at least one bulk portion. The semiconductor substrate 8 may have a built-in stress in the semiconductor region 10. While the present invention is described with a bulk substrate, implementation of the present invention on a hybrid substrate is explicitly contemplated herein.

The first deep trench 11A and the second deep trench 11B are formed by methods known in the art. Specifically, at least one pad layer 12 and a masking layer (not shown) are formed on a top surface 13 of the semiconductor substrate 8. The at least one pad layer 12 comprises a dielectric oxide layer, a dielectric nitride layer, or a stack thereof. For example, the at least one pad layer 12 may comprise a stack of a silicon oxide layer (not shown) and a silicon nitride layer (not shown). The silicon oxide layer may be located directly on the semiconductor region 10 and have a thickness from about 1 nm to about 30 nm, and typically from about 3 nm to about 12 nm. The silicon nitride layer may be located on the silicon oxide layer and have a thickness from about 30 nm to about 300 nm, and typically from about 60 nm to about 200 nm. The masking layer is formed on top of the at least one pad layer 12, and comprises another dielectric material, which may be borosilicate glass (BSG) or an undoped silicate glass (USG).

A photoresist (not shown) is applied over the masking layer and lithographically patterned to form two openings therein. Each opening corresponds to an area for the first deep trench 11A or for the second deep trench 11B. The pattern in the photoresist is transferred into the masking layer and the at least one pad layer 12 by an anisotropic etch. The photoresist may be removed at this point. The pattern in the masking layer and in the at least one pad layer 12 is transferred into the semiconductor substrate 8 by another anisotropic etch. The exposed portions of the semiconductor substrate 8 are removed by the anisotropic etch to form the first deep trench 11A and the second deep trench 11B.

Each of the first deep trench 11A and the second deep trench 11B includes substantially vertical sidewalls and a bottom surface. The angle between the substantially vertical sidewalls of the first deep trench 11A and the second deep trench 11B and a vertical line, i.e., a line perpendicular to the top surface 13 of the semiconductor substrate 8, may be from 0 degree to about 5 degrees, and preferably, from 0 degree to about 2 degrees. The depth of the bottom surface of the first deep trench 11A and the second deep trench 11B, which is herein referred to as a first depth d1, may be from about 1 micron to about 11 microns, and typically from about 3 microns to about 8 microns, although lesser and greater thicknesses are contemplated herein also. The deep trench is "deep" since the first depth d1 exceeds the depth of shallow trench isolation structures to be subsequently formed, which are filled with a dielectric material and have a depth less than 1 micron. The cross-sectional shape of each of the deep trenches (11A, 11B) may be elliptical or polygonal. For example, the cross-sectional shape of each of the deep trenches (11A, 11B) may be circular or rectangular. The cross-sectional shape of the first deep trench 11A or the second deep trench 11B may, or may not vary with depth depending on the crystallographic orientations of the semiconductor substrate 8 and etch characteristics of the anisotropic etch employed to form the first deep trench 11A and the second deep trench 11B. The masking layer is subsequently removed.

The semiconductor region 10, which may be the entirety of the semiconductor substrate 8 outside the first deep trench 11A and the second deep trench 11B at this point in case of a bulk semiconductor substrate, has a doping of a first conductivity type, which may be p-type or n-type. In case the first conductivity type is p-type, typical dopants within the semiconductor region 10 may be B, Ga, In, or a combination thereof. In case the first conductivity type is n-type, typical dopants within the semiconductor region 10 may be P, As, Sb, or a combination thereof. The dopant concentration of the semiconductor region 10 may be from about $1.0\times10^{15}/cm^3$ to about $3.0\times10^{19}/cm^3$, and typically from about $1.0\times10^{16}/cm^3$ to about $3.0\times10^{18}/cm^3$, although lesser and greater dopant concentrations are explicitly contemplated herein also.

Figure 2:
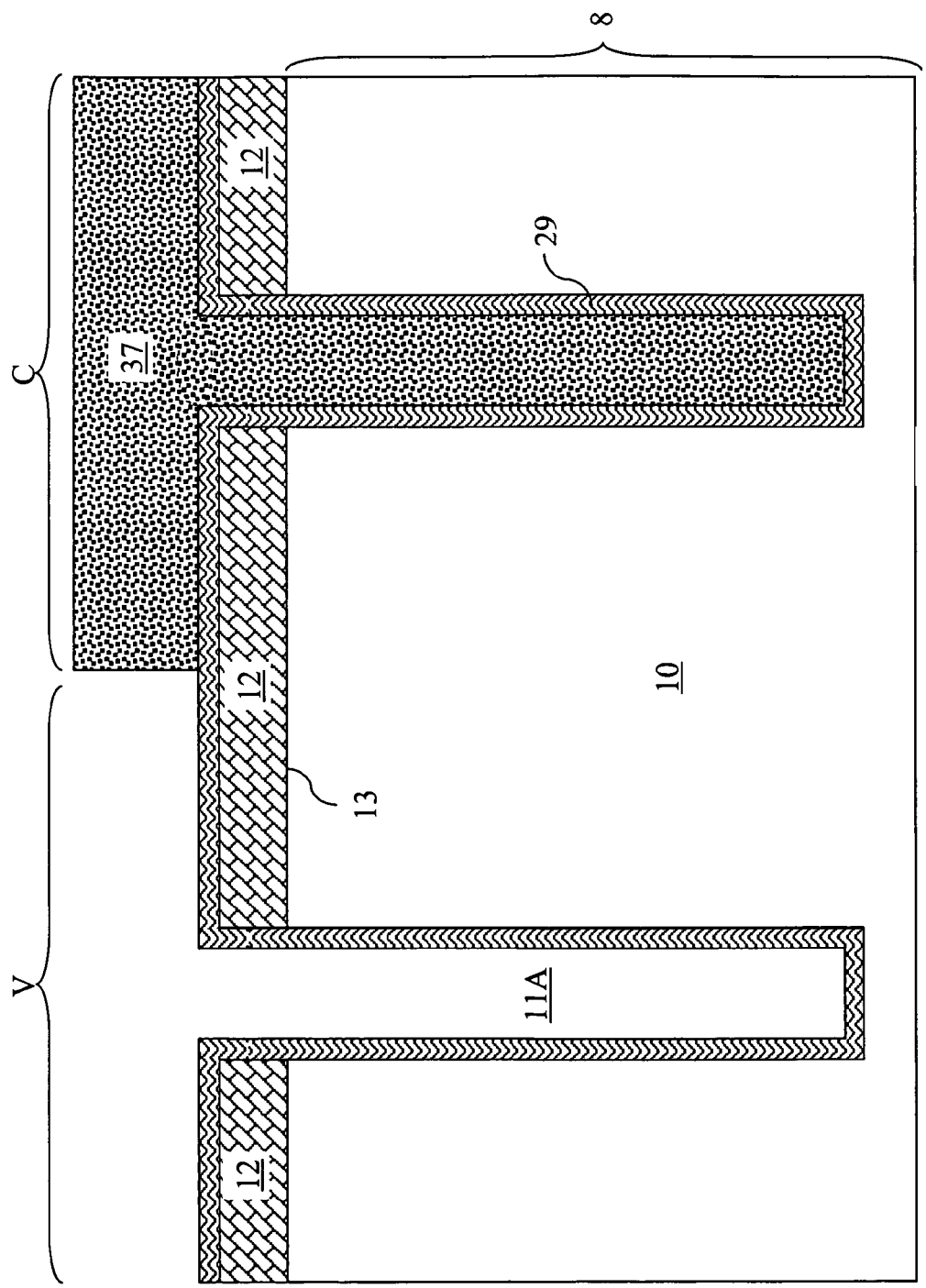
FIG. 2 is a vertical cross-sectional view of the first exemplary semiconductor structure after deposition of a dopant containing layer 29 and patterning of a fill material layer 37 according to the first embodiment of the present invention.

Referring to FIG. 2, a dopant containing layer 29 is formed by a conformal deposition of a dopant containing material. The dopant containing layer 29 comprises dopants of a second conductivity type, which is the opposite of the first conductivity type. For example, if the first conductivity type is p-type, the second conductivity type is n-type, and vice versa. The dopant containing layer 29 may comprise a doped silicate glass. If the second conductivity type is n-type, the dopant containing layer 29 may comprise arsenosilicate glass (ASG) or phosphosilicate glass (PSG). If the second conductivity type is p-type, the dopant containing layer 29 may comprise borosilicate glass (BSG). The conformal deposition may be effected, for example, by low pressure chemical vapor deposition (LPCVD). Due to the conformal nature of the deposition process, the entirety of the sidewalls and the bottom surface of the first deep trench 11A and the second deep trench 11B is covered with the dopant containing layer 29. The thickness of the dopant containing layer 29 may be from about 10 nm to about 100 nm, and typically from about 15 nm to about 60 nm.

A fill material 37 is applied over the dopant containing layer 29 including the inside of the first and second deep trenches (11A, 11B). The fill material layer 37 may comprise a photoresist that may be directly patterned by exposure and development. Alternately, the fill material may 37 may comprise a semiconductor material, an insulator material, or a metallic material that is patterned by application and patterning of a photoresist (not shown) and a subsequent transfer of the pattern in the photoresist by an anisotropic ion etch. After patterning of the fill material layer 37, the fill material layer 37 is present over a capacitor region C around the second deep trench 11B, and is absent over a varactor region V around the first deep trench 11A.

The exposed portions of the dopant containing layer 29 is removed from the varactor region V by an etch employing the fill material layer 37 as an etch mask. Preferably, the etch is selective to the semiconductor material of the semiconductor region 10. The etch may be a wet etch or a dry etch. After removal of the dopant containing layer 29 from the varactor region V, the fill material layer 37 is removed. Optionally, a capping layer (not shown) may be formed over the exposed surfaces of the semiconductor region 10 and the dopant containing layer 10 to prevent or reduce autodoping of surfaces of the semiconductor region 10 that do not directly contact the dopant containing layer 29.

Figure 3:
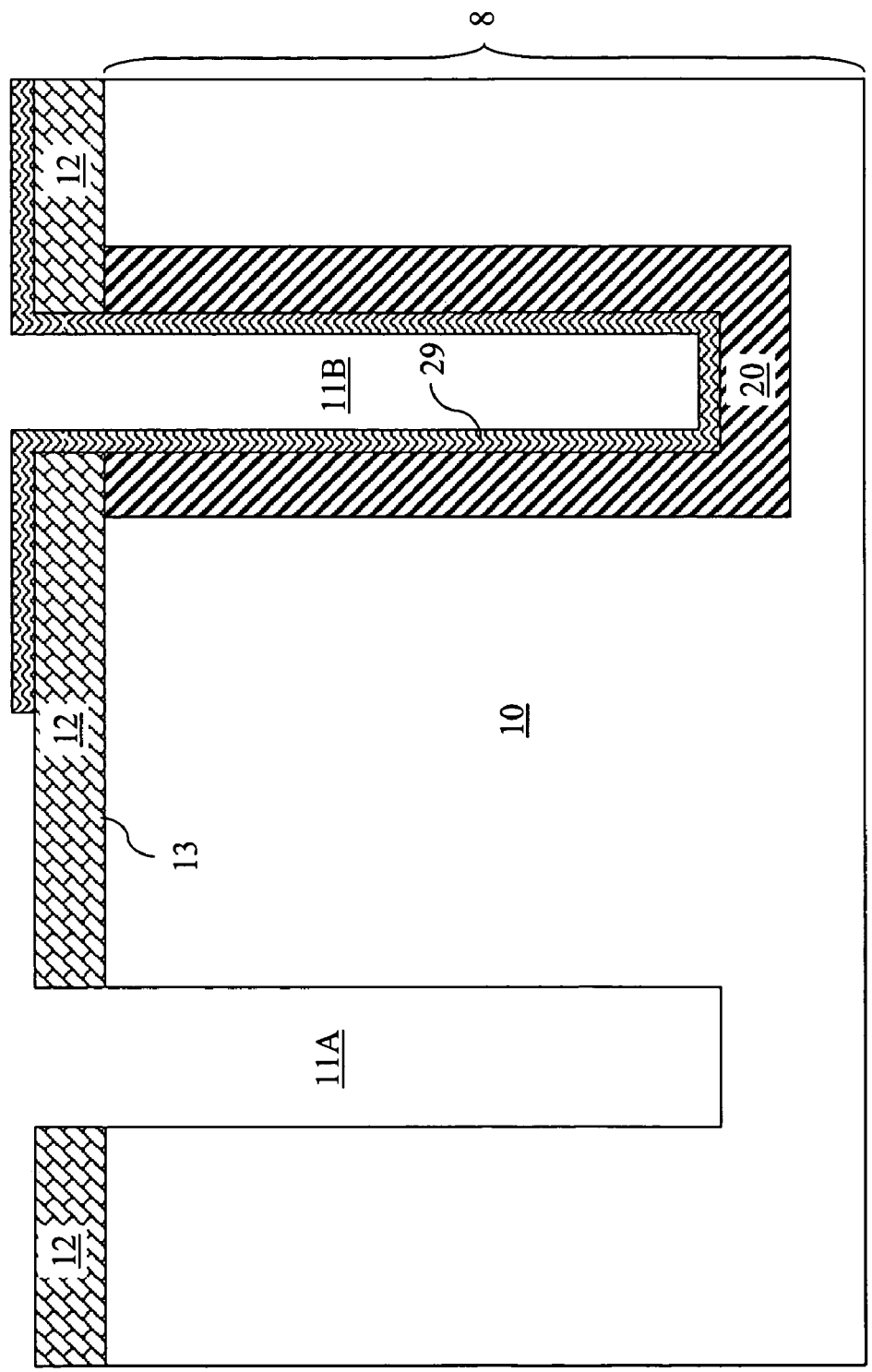
FIG. 3 is a vertical cross-sectional view of the first exemplary semiconductor structure after formation of a buried plate layer 20 according to the first embodiment of the present invention.

Referring to FIG. 3, a buried plate layer 20 is formed by outdiffusing dopants of the second conductivity type into a portion of the semiconductor region 10 abutting and laterally surrounding the sidewalls of the second deep trench 11B. Thus, the buried plate layer 20 has a doping of the second conductivity type. The buried plate layer 20 extends to the top surface 13 of the semiconductor substrate 8. The dopant concentration of the buried plate layer 20 may be from about $1.0\times10^{17}/cm^3$ to about $3.0\times10^{20}/cm^3$, and typically from about $1.0\times10^{18}/cm^3$ to about $3.0\times10^{19}/cm^3$, although lesser and greater dopant concentrations are explicitly contemplated herein also. The width of the buried plate layer 20, as measured laterally between a substantially vertical inner surface of the buried plate layer 20 which coincides with the sidewall of the first deep trench 11A and the second deep trench 11B and a substantially vertical outer surface of the buried plate layer 20, may be from about 30 nm to about 1 micron, and typically from about 100 nm to about 500 nm, although lesser and greater widths are explicitly contemplated herein also.

Since the dopant containing layer 29 is present only in the capacitor region C and is absent in the varactor region C, the buried plate layer 20 is formed only in the capacitor region C and is absent in the varactor region C. Thus, the entirety of the sidewalls of the first deep trench 11A comprises surfaces of the semiconductor region 10 having a doping of the first conductivity type. The entirety of the sidewalls of the second deep trench 11B comprises surfaces of the buried plate layer 20 having a doping of the second conductivity type. The dopant containing layer 29 and the capping layer, if any, are subsequently removed.

Figure 4:
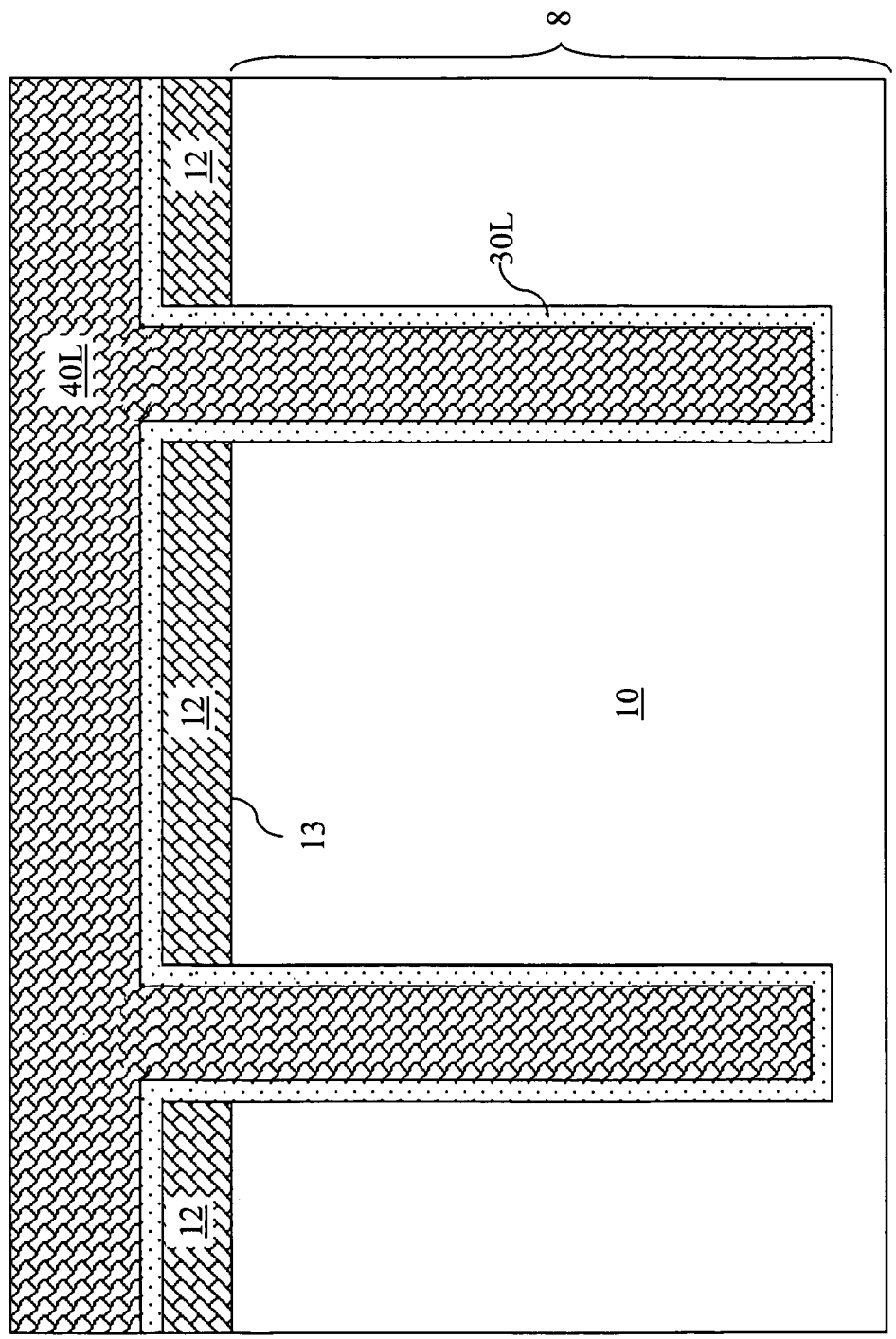
FIG. 4 is a vertical cross-sectional view of the first exemplary semiconductor structure after formation of a node dielectric layer 30L and an inner electrode layer 40L according to the first embodiment of the present invention.

Referring to FIG. 4, a node dielectric layer 30L is formed on the sidewalls and the bottom surfaces of the first deep trench 11A and the second deep trench 11B. The node dielectric layer 30L comprises a dielectric material such as silicon oxide, silicon oxynitride, silicon nitride, or a combination thereof. For example, the node dielectric layer 30L may comprise silicon nitride that is typically employed as a node dielectric in conventional deep trench capacitors. The node dielectric layer 30L may be formed by thermal nitridation, thermal oxidation, low pressure chemical vapor deposition (LPCVD), and/or a combination thereof. The thickness of the node dielectric layer 30L may be from about 2 nm to about 10 nm, and typically from about 3 nm to about 6 nm.

An inner electrode layer 40L is formed by deposition of a conductive material directly on the node dielectric layer 30L within the first deep trench 11A and the second deep trench 11B. Thus, the inner electrode layer 40L laterally abuts the inner walls of the node dielectric layer 30L. The inner electrode layer 40L may comprise a doped semiconductor material or a metallic material.

In case the inner electrode layer 40L comprises a doped semiconductor material, the conductivity type of the inner electrode layer 40L may be p-type or n-type. The crystalline structure of the inner electrode layer 40L may be polycrystalline or amorphous. The doped semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the inner electrode layer 40L is heavily doped to provide high conductivity. The dopant concentration of the inner electrode layer 40L may be from about $1.0 \times 10^{18}/cm^3$ to about $1.0 \times 10^{21}/cm^3$, and typically from about $1.0 \times 10^{19}/cm^3$ to about $5.0 \times 10^{20}/cm^3$, although lesser and greater dopant concentrations are explicitly contemplated herein also.

The inner electrode layer 40L may be formed by a single uninterrupted deposition of the doped semiconductor material within the first deep trench 11A and the second deep trench 11B, which may be effected, for example, by low pressure chemical vapor deposition (LPCVD), rapid thermal chemical vapor deposition (RTCVD), etc. In this case, the inner electrode layer 40L comprising the doped semiconductor material may be formed as a contiguous and homogeneous unitary structure without any manifested physical interface including a heterogeneous material therein. Absence of such manifested physical interface such as a native oxide layer, which may be formed if more than one deposition steps are employed with a break between or exposure to air, increases conductivity of the inner electrode layer 40L to provide reduced resistance in inner electrodes to be subsequently formed therefrom.

Alternately, the inner electrode layer 40L may comprise a metallic material such as an elemental metal, an alloy of a plurality of elemental metals, or a conductive metallic compound such as a conductive metal nitride. The metallic material may be selected from, but is not limited to, W, Ta, Ti, Cu, Al, TaN, TiN, WN, and layered stack or mixtures thereof. In this case, the inner electrode layer 40L comprising the metallic material may be formed as a contiguous and homogeneous unitary structure without any manifested physical interface including a heterogeneous material therein to provide reduced resistance in inner electrodes to be subsequently formed.

The portion of the inner electrode layer 40L above the at least one pad layer 12 is planarized by chemical mechanical planarization (CMP) or a recess etch. The node dielectric layer 30L or the at least one pad layer 12 may be employed as a stopping layer.

Figure 5:
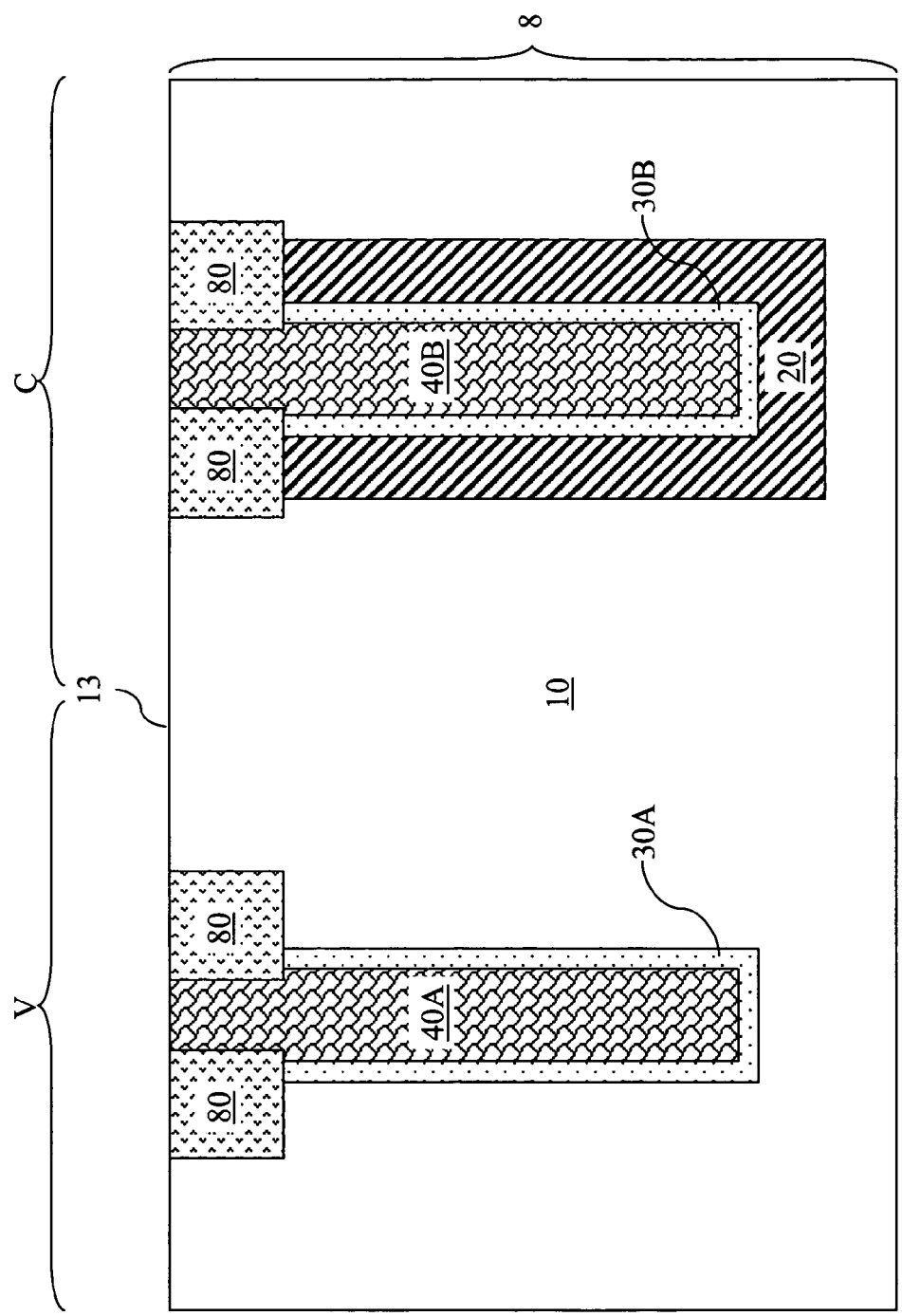
FIG. 5 is a vertical cross-sectional view of the first exemplary semiconductor structure after formation of a first node dielectric 30A, a second node dielectric 30B, an varactor inner electrode 40A, a capacitor inner electrode 40B, and shallow trench isolation structures according to the first embodiment of the present invention.

Referring to FIG. 5, shallow trenches having a depth less than 1,000 nm, and typically less than 500 nm, are formed in the at least one pad layer 12 and upper portions of the semiconductor region 10. The shallow trenches include a first shallow trench that laterally surrounds a portion of the inner electrode layer 40L within the first deep trench 11A. Thus, the first shallow trench overlies sidewalls of the first deep trench 11A. Similarly, a second shallow trench overlying sidewalls of the second deep trench 11B laterally surrounds a portion of the inner electrode layer 40L within the second trench 11B.

A dielectric material is deposited in the first shallow trench and the second shallow trench. The dielectric material may comprise a chemical vapor deposition (CVD) silicon oxide that may be deposited by plasma enhanced chemical vapor deposition (PECVD), high density plasma chemical vapor deposition (HDPCVD), low pressure chemical vapor deposition (LPCVD), or rapid thermal chemical vapor deposition (RTCVD). The dielectric material may, or may not, comprise a liner material such as silicon nitride or silicon oxynitride. Preferably, the dielectric material comprises an undoped silicate glass (USG) deposited by high density plasma chemical vapor deposition (HDPCVD). The dielectric material is subsequently planarized, for example, by chemical mechanical planarization (CMP), a recess etch, or a combination thereof. The top surface of the node dielectric layer 30L or the at least one pad layer 12 may be employed as a stopping layer. The remaining portions of the dielectric material are recessed to a level that is substantially coplanar with the top surface 13 of the semiconductor substrate 8. The remaining portions of the dielectric material constitute shallow trench isolation structures 80.

The remaining portion of the inner electrode layer 40L within the first trench 11A constitutes a varactor inner electrode 40A since this portion functions as an inner electrode of a varactor of the present invention to be subsequently described. The remaining portion of the inner electrode layer 40L within the second trench 11B constitutes a capacitor inner electrode 40B since this portion functions as an inner electrode of a linear capacitor, i.e., a capacitor having a constant capacitance and the amount of charge stored therein changes linearly with the voltage differential across a node dielectric.

The remaining portion of the node dielectric layer 30L within the first trench 11A constitutes a first node dielectric 30A, which functions as a node dielectric of the varactor of the present invention. The remaining portion of the node dielectric layer 30L within the second trench 11B constitutes a second node dielectric 30B since this portion functions as the node dielectric of the linear capacitor.

The portions of the varactor inner electrode 40A and the capacitor inner electrode 40B above the top surface 13 of the semiconductor substrate 8 are recessed or etched so that top surfaces of the varactor inner electrode 40A and the capacitor inner electrode 40B are substantially coplanar with the top surface 13 of the semiconductor substrate 8. The at least one pad layer 12 is subsequently removed selective to the semiconductor region 10 and the varactor inner electrode 40A and the capacitor inner electrode 40B. The etch employed to remove the at least one pad layer 12 may be selective to the shallow trench isolation structures 80, or the recess depth of the shallow trench isolation structures 80 during formation of the shallow trench isolation structures 80 may be adjusted to account for any additional loss of material during the removal of the at least one pad layer 12 so that the top surfaces of the shallow trench isolation structures 80 are substantially coplanar with the top surface 13 of the semiconductor substrate 8.

Figure 6:
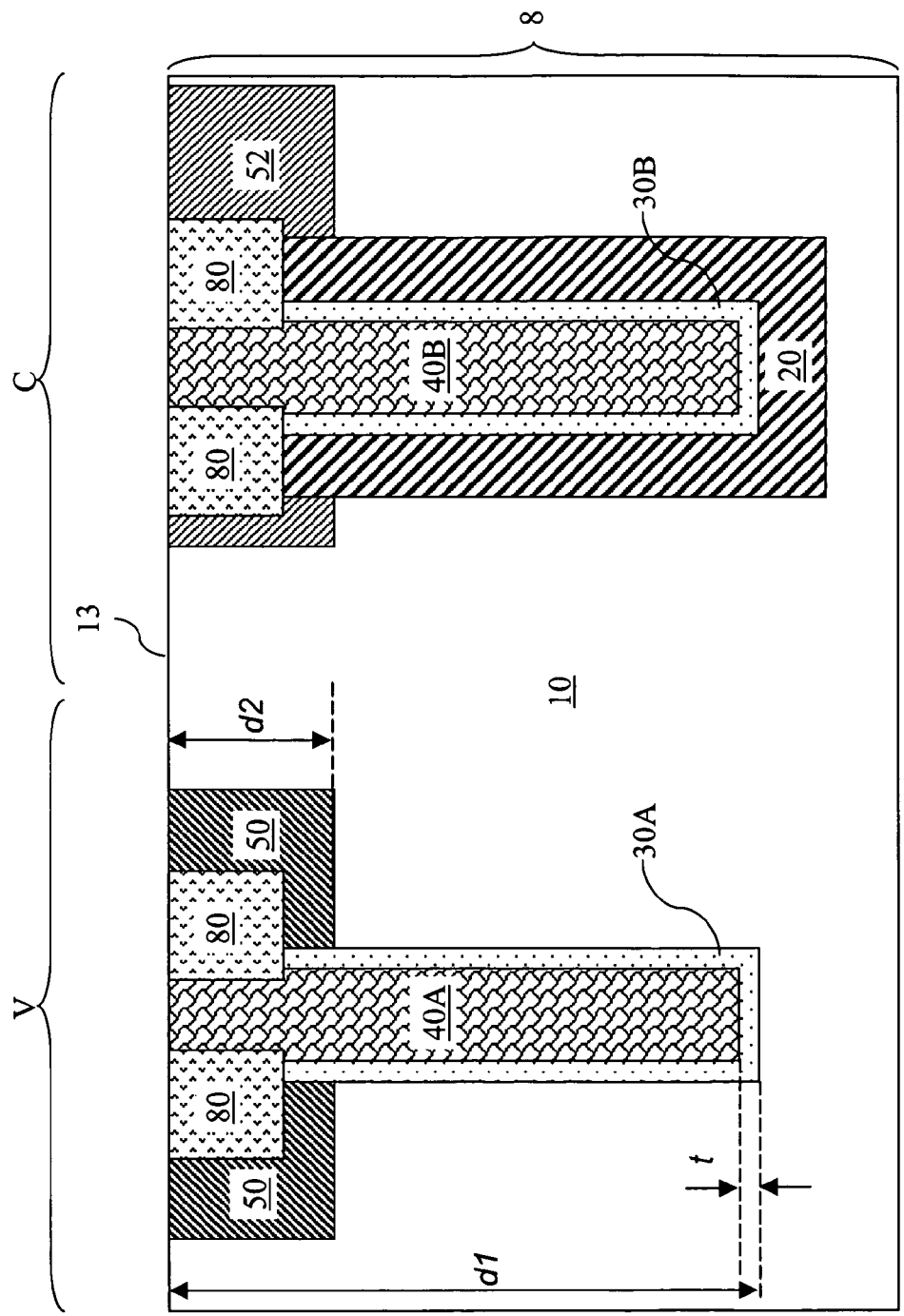
FIG. 6 is a vertical cross-sectional view of the first exemplary semiconductor structure after formation of a varactor-electrode doped well 50 and a buried plate contact doped well 52 according to the first embodiment of the present invention.

Referring to FIG. 6, a first doped well 50 is formed in the varactor region V by masked ion implantation. Sequentially or concurrently, a capacitor region doped well 52 is formed in the capacitor region C by masked ion implantation. The first doped well 50 may have a doping of the second conductivity type or the first conductivity type, i.e., a doping of the opposite conductivity type of, or a doping of the same conductivity type as, the doping of the semiconductor region 10, which has a doping of the first conductivity type. The depth of the first doped well 50, which is herein referred to as a second depth d2, is less than the first depth d1, and is from about 100 nm to about 2,000 nm, and typically from about 200 nm to about 1,200 nm, although lesser and greater depths are also contemplated herein. The capacitor region doped well 52 has a doping of the second conductivity type, which is the same conductivity type as the conductivity type of the buried plate 20 in the capacitor region C. The second depth d2 is preferably greater than the depth of the bottom of the shallow trench isolation structures 80.

The dopant concentration of the first doped well 50 may be from about $1.0 \times 10^{16}/cm^3$ to about $5.0 \times 10^{20}/cm^3$, and typically from about $1.0 \times 10^{17}/cm^3$ to about $1.0 \times 10^{20}/cm^3$, although lesser and greater dopant concentrations are also explicitly contemplated herein. Preferably, the first doped well 50 has a doping of the second conductivity type. The dopant concentration of the capacitor region doped well 52 may be from about $1.0 \times 10^{18}/cm^3$ to about $1.0 \times 10^{21}/cm^3$, and typically from about $1.0 \times 10^{19}/cm^3$ to about $1.0 \times 10^{20}/cm^3$, although lesser and greater dopant concentrations are also explicitly contemplated herein. If the first doped well 50 and the capacitor region doped well 52 are formed at the same ion implantation processing step employing the same mask, the first doped well 50 and the capacitor region doped well 52 have the same doping type, the same dopant concentration, and the same depth, i.e., the depth of the capacitor region doped well 52 is the same as the second depth d2.

The varactor region V comprises a first exemplary varactor according to the first embodiment of the present invention. The first exemplary varactor comprises the varactor inner electrode 40A, the first node dielectric 30A, and the first doped well 50. The varactor inner electrode 40A extends from the top surface 13 of the semiconductor substrate 8 to a depth, which is equal to the first depth d1 less the thickness of the first node dielectric 30A. The varactor inner electrode 40A comprises the conductive material described above. The first node dielectric 30A is the dielectric material of the first exemplary varactor.

The first doped well 50 comprises a doped semiconductor material, of which the portion abutting the first node dielectric 30A may be placed in an accumulation mode or a depletion mode depending on the voltage bias across the first node dielectric 30A. For example, if the first doped well 50 have a p-type doping and the voltage bias at the first doped well 50 is positive relative to the voltage at the varactor inner electrode 40A, the portion of the first doped well 50 laterally surrounding and abutting an upper portion of the first node dielectric 30A is driven into an accumulation mode in which holes present in the first doped well 50 are attracted to the first node dielectric 30A. In the accumulation mode, the first exemplary varactor (30A, 40A, 50) provides high capacitance. If the first doped well 50 have the p-type doping and the voltage bias at the first doped well 50 is negative relative to the voltage at the varactor inner electrode 40A, the portion of the first doped well 50 laterally surrounding and abutting an upper portion of the first node dielectric 30A is driven into a depletion mode in which holes present in the first doped well 50 are repelled away from the first node dielectric 30A. In the depletion mode, the first exemplary varactor (30A, 40A, 50) provides low capacitance. Thus, the first exemplary varactor (30A, 40A, 50) has voltage dependent capacitance.

Alternately, if the first doped well 50 have an n-type doping and the voltage bias at the first doped well 50 is negative relative to the voltage at the varactor inner electrode 40A, the portion of the first doped well 50 laterally surrounding and abutting an upper portion of the first node dielectric 30A is driven into an accumulation mode in which electrons present in the first doped well 50 are attracted to the first node dielectric 30A. In the accumulation mode, the first exemplary varactor (30A, 40A, 50) provides high capacitance. If the first doped well 50 have the n-type doping and the voltage bias at the first doped well 50 is positive relative to the voltage at the varactor inner electrode 40A, the portion of the first doped well 50 laterally surrounding and abutting an upper portion of the first node dielectric 30A is driven into a depletion mode in which electrons present in the first doped well 50 are repelled away from the first node dielectric 30A. In the depletion mode, the first exemplary varactor (30A, 40A, 50) provides low capacitance. Thus, the first exemplary varactor (30A, 40A, 50) has voltage dependent capacitance.

The portion of the first doped well 50 that abuts the first node dielectric 30A extends from a bottom surface of one of the shallow trench isolation structures 80 that abuts and laterally surrounds the varactor inner electrode 40A to the second depth d2.

The capacitor region C comprises an exemplary capacitor, which comprises the capacitor inner electrode 40B, the second node dielectric 30B, and the capacitor region doped well 52. The capacitor inner electrode 40B extends from the top surface 13 of the semiconductor substrate 8 to a depth which is substantially equal to the depth of the varactor inner electrode, i.e., a depth equal to the first depth d1 less the thickness of the first node dielectric 30A. The capacitor inner electrode 40B comprises the conductive material described above. The capacitor region doped well 52 provides electrical contact to the buried plate 20. Due to the heavy doping of the buried plate 20, the exemplary capacitor (20, 30B, 40B) has substantially voltage independent capacitance, i.e., the exemplary capacitor (20, 30B, 40B) is a linear capacitor in which the amount of stored charge is linearly proportional to the voltage difference across the inner electrode 40B and the buried plate 20. In other words, the exemplary capacitor (20, 30B, 40B) has a constant capacitance.

If the inner electrode layer 40L is formed as a contiguous and homogeneous unitary structure without any manifested physical interface including a heterogeneous material therein at the processing step of FIG. 4, each of the varactor inner electrode 40A and the capacitor inner electrode 40B is a structure of contiguous and homogeneous unitary construction without any manifested physical interface including a heterogeneous material therein. Such absence of such manifested physical interface such as a native oxide layer provides increases conductivity of the varactor inner electrode 40A and the capacitor inner electrode 40B.

Metal semiconductor alloys regions (not shown) may be optionally formed on the varactor inner electrode 40A, the capacitor inner electrode 40B, the first doped well 50, and/or the capacitor region doped well 52.

Figure 7:
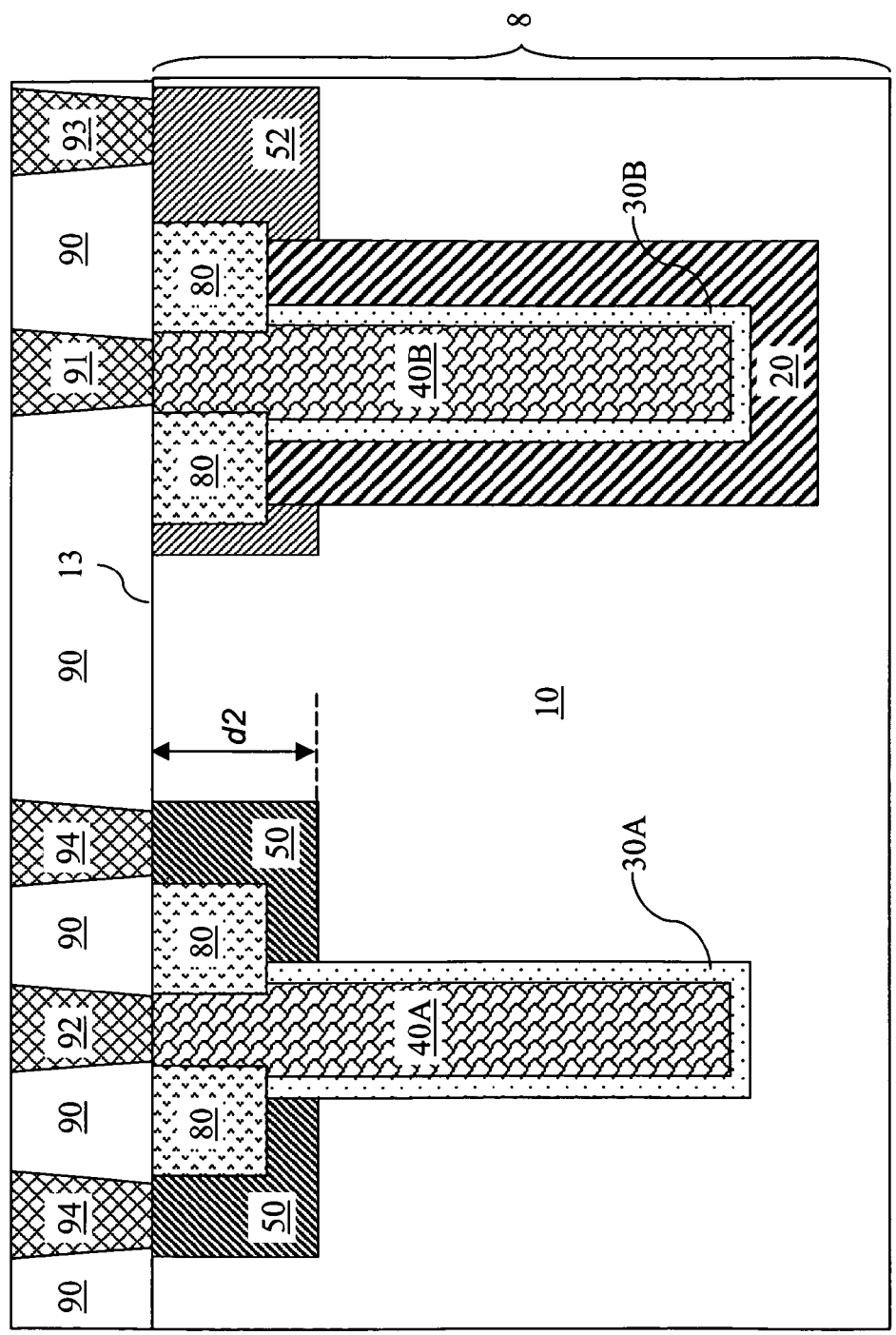
FIG. 7 is a vertical cross-sectional view of the first exemplary semiconductor structure after formation of a middle-of-line (MOL) dielectric layer 90, a first varactor electrode contact via 92, second varactor electrode contact vias 94, a first capacitor electrode contact via 91, and a second capacitor electrode contact via 93 according to the first embodiment of the present invention.
Figure 8:
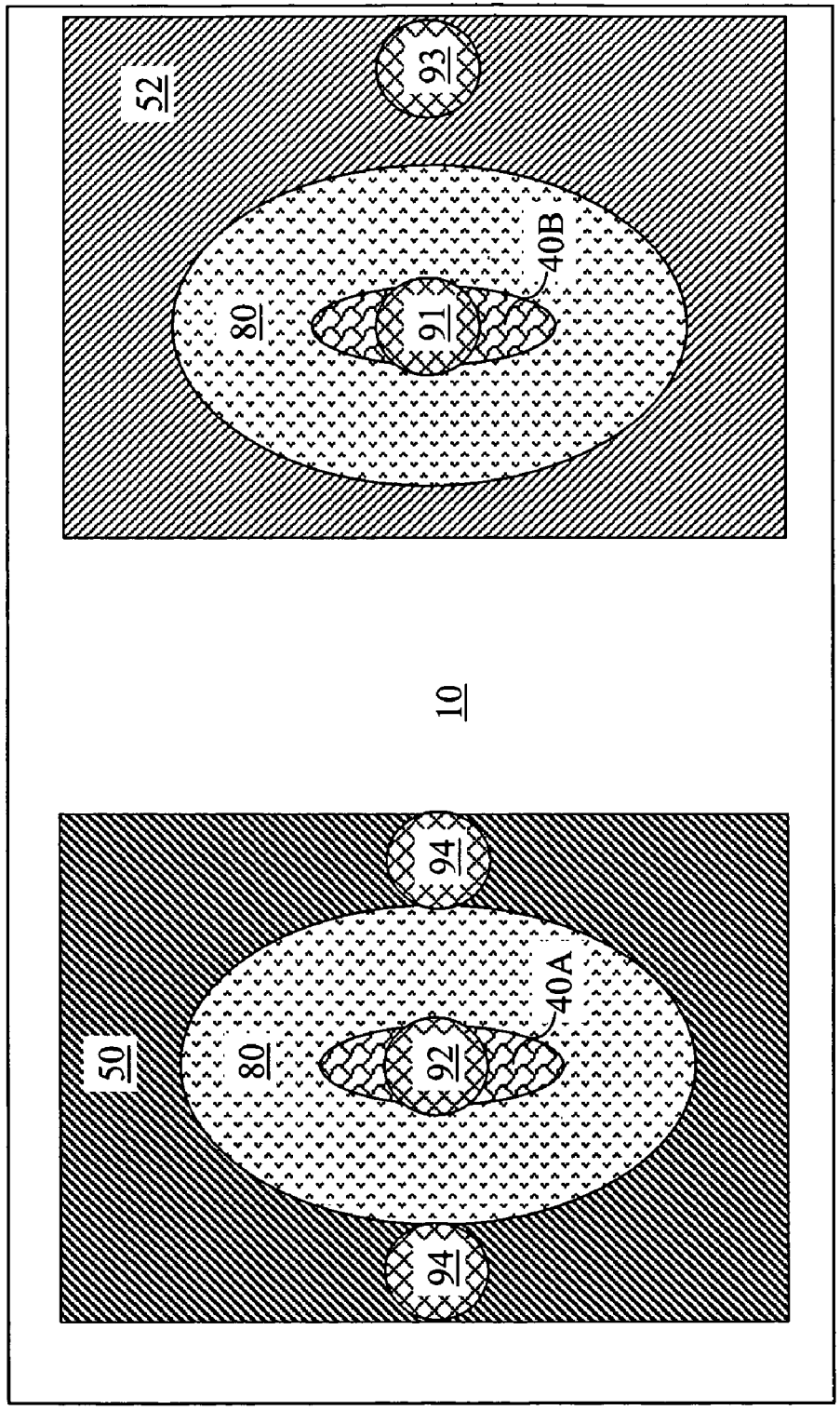
FIG. 8 is a top down view of the first exemplary semiconductor structure of FIG. 7 in which the MOL dielectric layer 90 is not shown for clarity.

Referring to FIGS. 7 and 8, a middle-of-line (MOL) dielectric layer 90, which may include a mobile ion barrier layer (not shown), is deposited over varactor inner electrode 40A, the capacitor inner electrode 40B, the first doped well 50, the capacitor region doped well 52, and the shallow trench isolation regions 80. FIG. 7 is a vertical cross-sectional view, and FIG. 8 is a top down view from which the MOL dielectric layer 90 is omitted for clarity. The MOL dielectric layer 90 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Various contact via holes are formed in the MOL dielectric layer 90 and filled with metal to from various contact vias, which include a first contact via 92, at least one second contact via 94, a capacitor inner electrode contact via 91, and a capacitor region doped well contact via 93. The first contact via 92 may vertically abut the varactor inner electrode 40A. The at least one second contact via 94 may vertically abut the first doped well 50. The capacitor inner electrode contact via 91 may vertically abut the capacitor inner electrode 40B. The capacitor region doped well contact via 93 may vertically abut the capacitor region doped well 52 A first level metal wiring (not shown) is thereafter formed, followed by formation of further back-end-of-line (BEOL) structures.

Figure 9:
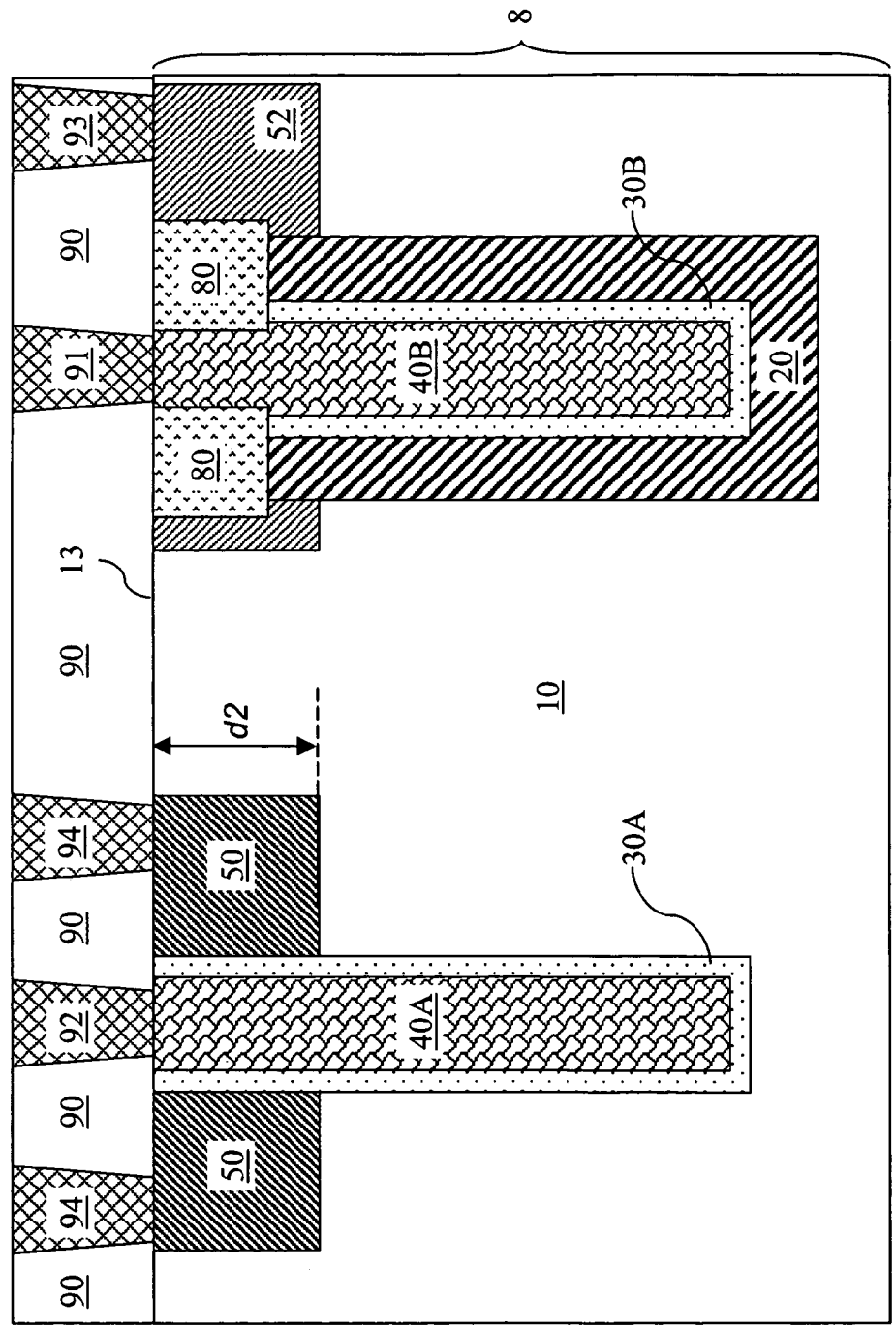
FIG. 9 is a vertical cross-sectional view of a second exemplary semiconductor structure according to a second embodiment of the present invention at a step corresponding to FIG. 7 of the first embodiment of the present invention.
Figure 10:
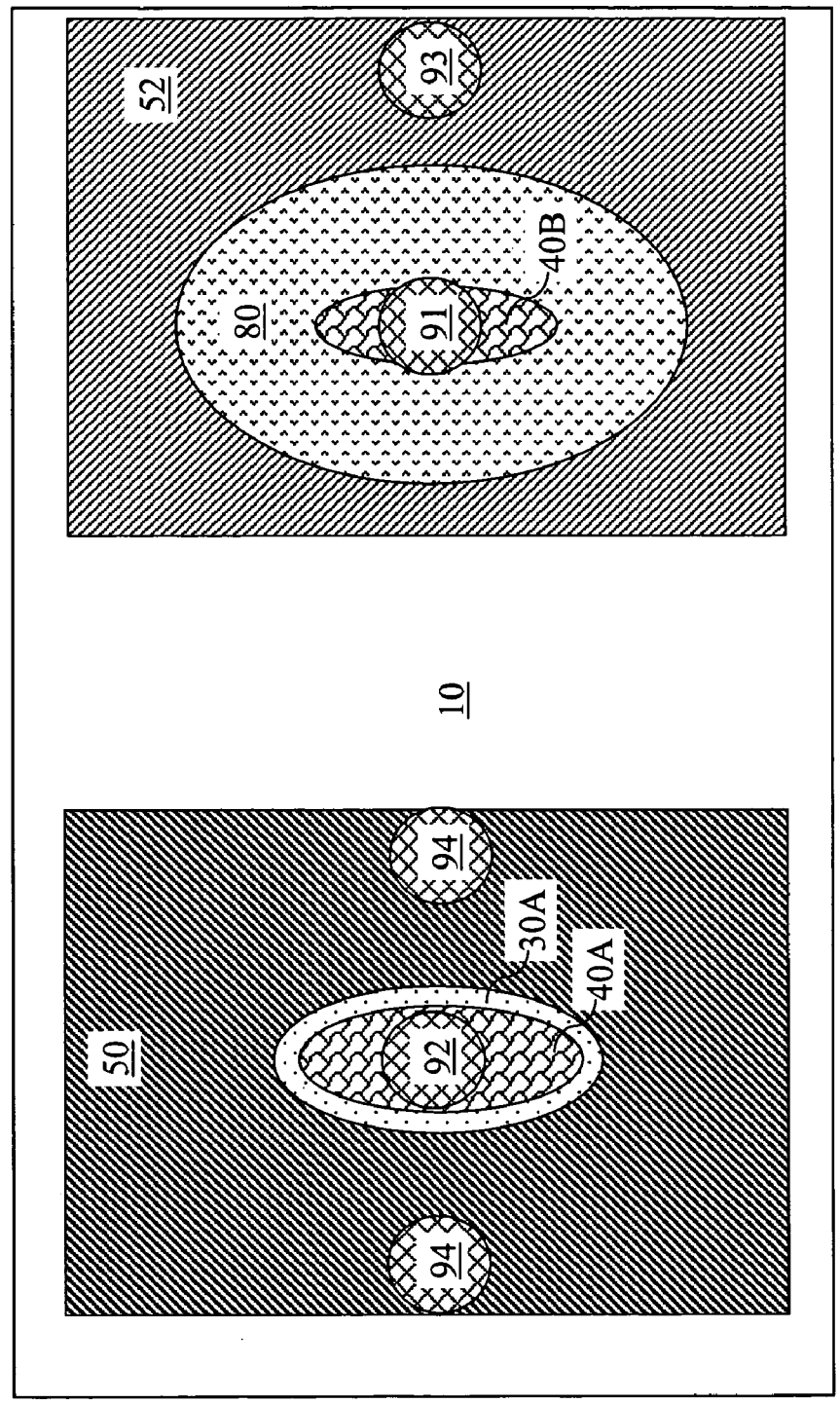
FIG. 10 is a top down view of the second exemplary semiconductor structure of FIG. 9 in which the MOL dielectric layer 90 is not shown for clarity.

Referring to FIGS. 9 and 10, a second exemplary semiconductor structure according to a second embodiment of the present invention is shown. FIG. 9 is a vertical cross-sectional view, and FIG. 10 is a top down view from which the MOL dielectric layer 90 is omitted for clarity. The second exemplary semiconductor structure comprises a second exemplary varactor, which comprises a varactor inner electrode 40A, a first node dielectric 30A, and a first doped well 50. The first doped well laterally surrounds and abuts an upper portion of the first node dielectric 30A from the top surface 13 of the semiconductor substrate 10 to the second depth d2. The second exemplary semiconductor structure is derived from the first exemplary semiconductor structure by omitting formation of a shallow trench isolation structure 80 that surrounds the varactor inner electrode 40A in the varactor region V. The portion of the first doped well 50 that abuts the first node dielectric 30A extends from the top surface 13 of the semiconductor substrate 8 to the second depth d2. The second exemplary varactor of the second embodiment provides increased capacitance over the first exemplary varactor of the first embodiment by increased area of contact between the first doped well 50 and the first node dielectric due to the absence of any shallow trench isolation structure between the first doped well 50 and the varactor inner electrode 40A.

Figure 11:
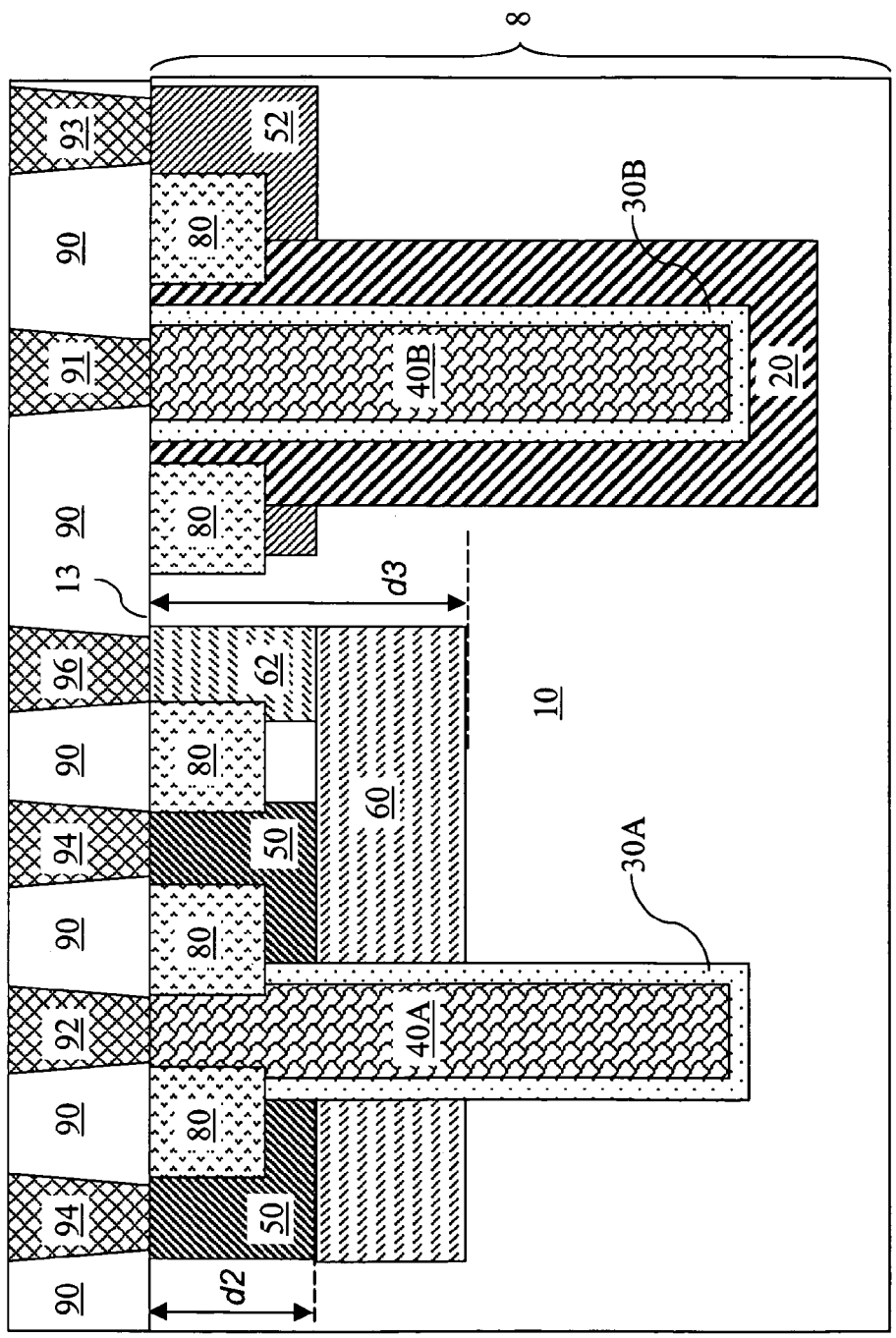
FIG. 11 is a vertical cross-sectional view of a third exemplary semiconductor structure according to a third embodiment of the present invention.

Referring to FIG. 11, a third exemplary semiconductor structure according to a third embodiment of the present invention is derived from the first exemplary semiconductor structure by formation of a second doped well 60 and a first reachthrough 62 providing electrical contact to the second doped well 60. The second doped well 60 and the first reachthrough 62 are formed by masked ion implantation. The second doped well 60 is formed directly underneath the first doped well 50. The depth of the bottom surface of the second doped well 60, which is herein referred to as a third depth d3, is greater than the second depth d2 (See FIG. 7) and less than the first depth d1. The third depth d3 may be from about 200 nm to about 2,000 nm, and typically from about 400 nm to about 1,500 nm, although lesser and greater depths are also contemplated herein. The second doped well 60 and the first doped well 50 have different dopant concentrations or different doping conductivity types. The second doped well 60 has the same conductivity type as the first reachthrough 62.

In one case, the second doped well 60 and the first reachthrough 62 have the opposite conductivity type than the first doped well 50. If the first doped well 50 has a p-type doping, the second doped well 60 has an n-type doping, and vice versa. The conductivity type of the second doped well 60 may be the same as, or may be the opposite of, the conductivity type of the semiconductor layer 10. The dopant concentration of the second doped well 60 may be from about $1.0\times10^{16}/cm^3$ to about $5.0\times10^{20}/cm^3$, and typically from about $1.0\times10^{17}/cm^3$ to about $1.0\times10^{20}/cm^3$, although lesser and greater dopant concentrations are also explicitly contemplated herein. The dopant concentration of the first feedthrough 62 may be from about $1.0\times10^{19}/cm^3$ to about $5.0\times10^{20}/cm^3$, and typically from about $3.0\times10^{19}/cm^3$ to about $3.0\times10^{20}/cm^3$, although lesser and greater dopant concentrations are also explicitly contemplated herein.

In another case, the second doped well 60 and the first reachthrough 62 have the same conductivity type as the first doped well 50. In this case, the second doped well 60 has a different dopant concentration than the first doped well 50. The dopant concentration of the second doped well 60 may be from about $1.0\times10^{16}/cm^3$ to about $5.0\times10^{20}/cm^3$, and typically from about $1.0\times10^{17}/cm^3$ to about $1.0\times10^{20}/cm^3$, although lesser and greater dopant concentrations are also explicitly contemplated herein.

A third contact via 96 is formed in the MOL dielectric layer 90 to provide electrical contact to the first reachthrough 62, which extends from a top surface of the second doped well 60 to the top surface 13 of the semiconductor substrate 8.

The third exemplary semiconductor structure comprises a third exemplary varactor, which comprises the varactor inner electrode 40A, the first node dielectric 30A, the first doped well 50, and the second doped well 60. The at least one second contact via 94 and the third contact via 96 may, or may not, be electrically connected by a metal interconnect structure (not shown). In case the at least one second contact via 94 and the third contact via 96 are electrically shorted by the metal interconnect structure, the third exemplary varactor is a two terminal device which provides a voltage dependent capacitance that is determined by the sum of a first capacitance between the varactor inner electrode 40A and the first doped well 50 and a second capacitance between the varactor inner electrode 40A and the second doped well 60. Both the first capacitance and the second capacitance may be voltage dependent. The third exemplary varactor comprises a first component varactor having the first capacitance and the second component varactor having the second capacitance. Each of the first component varactor and the second component varactor may operate between an accumulation mode and a depletion mode as in the first exemplary varactor of the first embodiment.

Alternately, the at least one second contact via 94 may not be electrically connected to the third contact via 96. In this case, the third exemplary varactor is a three terminal device. The voltage applied to the first doped well 50 may modulate the capacitance of the second component capacitor comprising the varactor inner electrode 40A, the first node dielectric 30A, and the second doped well 60. Alternately, the voltage applied to the second doped well 60 may modulate the capacitance of the first component capacitor comprising the varactor inner electrode 40A, the first node dielectric 30A, and the first doped well 50.

Figure 12:
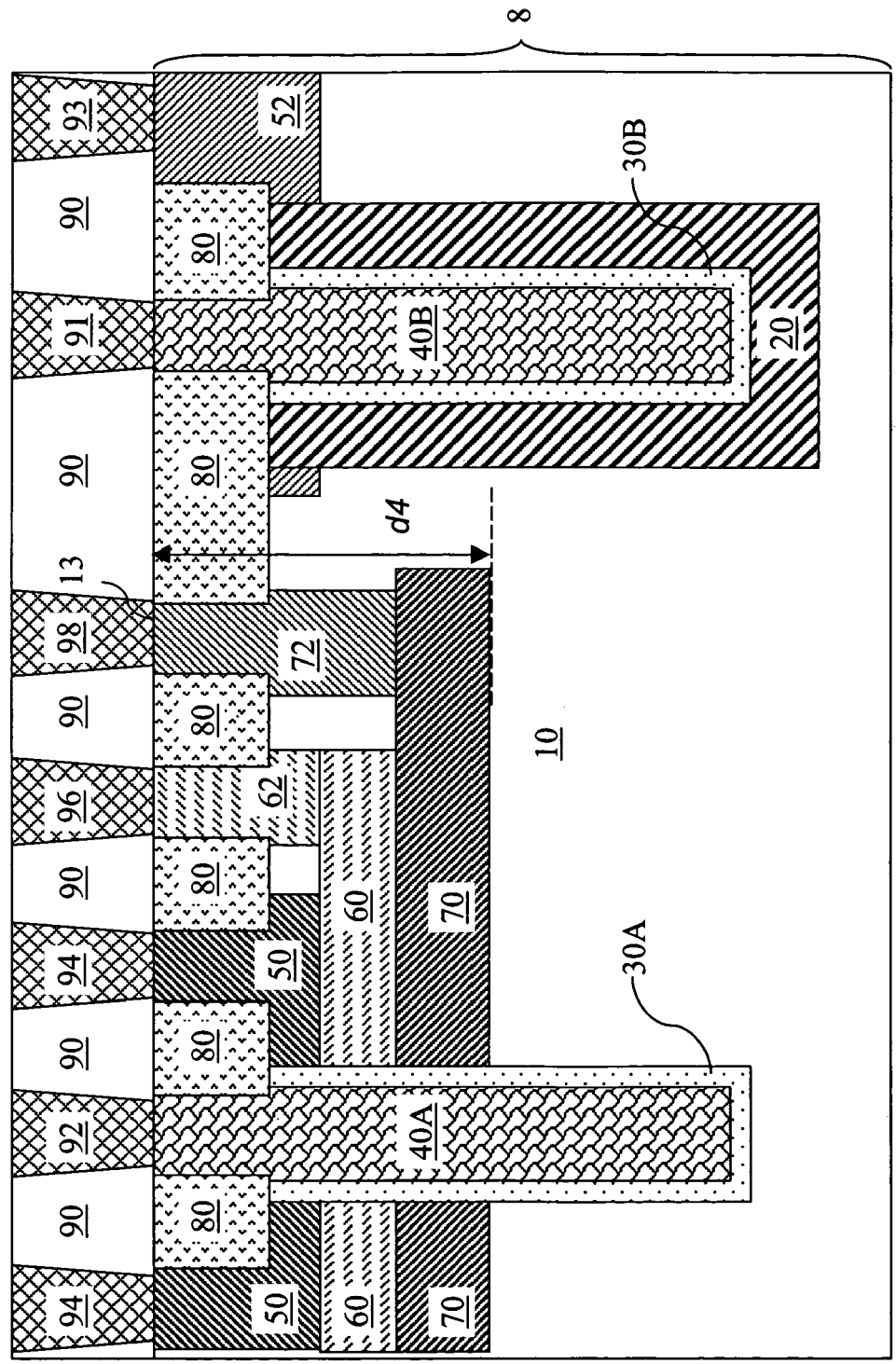
FIG. 12 is a vertical cross-sectional view of a fourth exemplary semiconductor structure according to a fourth embodiment of the present invention.

Referring to FIG. 12, a fourth exemplary semiconductor structure according to a fourth embodiment of the present invention is derived from the third exemplary semiconductor structure by formation of a third doped well 70 and a second reachthrough 72 providing electrical contact to the third doped well 60. The third doped well 70 and the second reachthrough 72 are formed by masked ion implantation. The third doped well 70 is formed directly underneath the second doped well 60. The depth of the bottom surface of the third doped well 70, which is herein referred to as a fourth depth d4, is greater than the third depth d3 (See FIG. 11) and less than the first depth d1. The fourth depth d4 may be from about 300 nm to about 2,000 nm, and typically from about 600 nm to about 2,000 nm, although lesser and greater depths are also contemplated herein. The third doped well 70 has a different dopant concentration or a different doping conductivity type than the first doped well 50. The third doped well 70 has a different dopant concentration or a different doping conductivity type than the second doped well 60. The third doped well 70 has the same conductivity type as the second reachthrough 72.

Preferably, each of the third doped well 70, the second reachthrough 72, and the first doped well 50 has a doping of the second conductivity type, and each of the semiconductor region 10, the second doped well 60, and the first reachthrough 62 has a doping of the first conductivity type, which is the opposite of the second conductivity type. The dopant concentration of the third doped well 70 may be from about $1.0 \times 10^{16}/cm^3$ to about $5.0 \times 10^{20}/cm^3$, and typically from about $1.0 \times 10^{17}/cm^3$ to about $1.0 \times 10^{20}/cm^3$, although lesser and greater dopant concentrations are also explicitly contemplated herein. The dopant concentration of the second feedthrough 72 may be from about $1.0 \times 10^{19}/cm^3$ to about $5.0 \times 10^{20}/cm^3$, and typically from about $3.0 \times 10^{19}/cm^3$ to about $3.0 \times 10^{20}/cm^3$, although lesser and greater dopant concentrations are also explicitly contemplated herein.

A fourth contact via 98 is formed in the MOL dielectric layer 90 to provide electrical contact to the second reachthrough 72, which extends from a top surface of the third doped well 70 to the top surface 13 of the semiconductor substrate 8.

The fourth exemplary semiconductor structure comprises a fourth exemplary varactor, which comprises the varactor inner electrode 40A, the first node dielectric 30A, the first doped well 50, the second doped well 60, the third doped well 70. Some of the at least one second contact via 94, the third contact via 96, and the fourth contact via 98 may, or may not, be electrically connected by a metal interconnect structure (not shown). In case the at least one second contact via 94, the third contact via 96, and the fourth contact via 98 are electrically shorted by the metal interconnect structure, the fourth exemplary varactor is a two terminal device which provides a voltage dependent capacitance that is determined by the sum of a first capacitance between the varactor inner electrode 40A and the first doped well 50, a second capacitance between the varactor inner electrode 40A and the second doped well 60, and a third capacitance between the varactor inner electrode 40A and the third doped well 70. Each of the first capacitance, the second capacitance, and the third capacitance may be voltage dependent. The fourth exemplary varactor comprises a first component varactor having the first capacitance, the second component varactor having the second capacitance, and the third component varactor having the third capacitance. Each of the first component varactor, the second component varactor, and the third component varactor may operate between an accumulation mode and a depletion mode as in the first exemplary varactor of the first embodiment.

In case only a pair of the at least one second contact via 94, the third contact via 96, and the fourth contact via 98 is electrically shorted by a metal interconnect structure, while one of the contact vias (94, 96, 98) to the various doped wells (50, 60, 70) is electrically disconnected from the rest, the fourth exemplary varactor is a three terminal device which may provide a voltage dependent capacitance. Three component capacitances are present in the fourth exemplary varactor, which includes a first component capacitor having a first capacitance between the varactor inner electrode 40A and the first doped well 50, a second component capacitor having a second capacitance between the varactor inner electrode 40A and the second doped well 60, and a third component capacitor having a third capacitance between the varactor inner electrode 40A and the third doped well 70. The capacitance of at least one of the three component capacitors may be modulated by a voltage applied to another component capacitor.

In case the at least one second contact via 94, the third contact via 96, and the fourth contact via 98 are not electrically shorted among one another, the fourth exemplary varactor is a four terminal device which may provide a voltage dependent capacitance. Each of the three component capacitances may be modulated by a voltage applied to another component capacitor.

Figure 13:
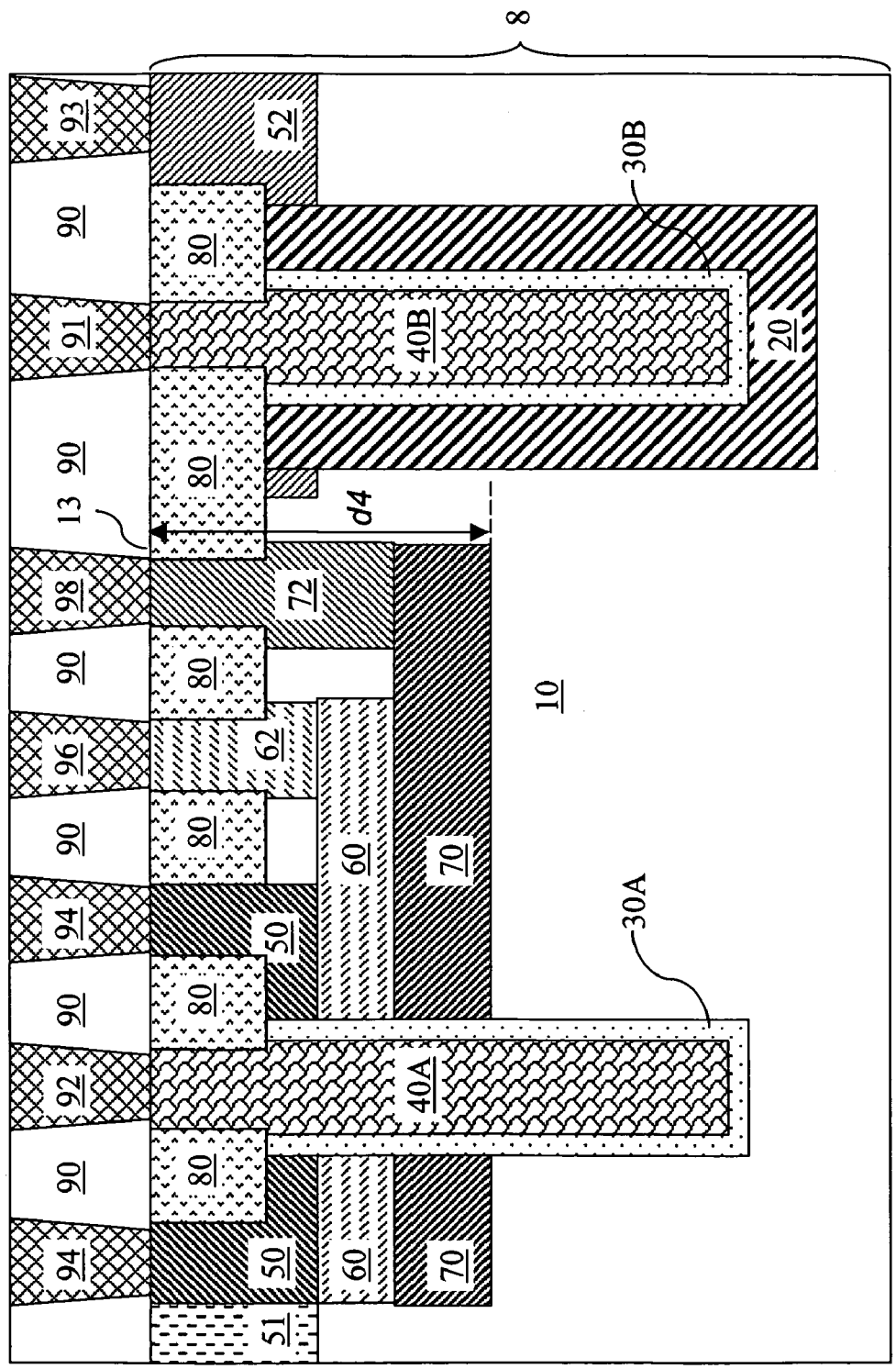
FIG. 13 is a vertical cross-sectional view of a fifth exemplary semiconductor structure according to a fifth embodiment of the present invention.

Referring to FIG. 13, a fifth exemplary semiconductor structure according to a fifth embodiment of the present invention is derived from the third exemplary semiconductor structure by formation of a third doped well 70 and a second reachthrough 72 providing electrical contact to the third doped well 70. The third doped well 70 and the second reachthrough 72 are formed by masked ion implantation. The third doped well 70 is formed directly underneath the second doped well 60. The depth of the bottom surface of the third doped well 70, which is herein referred to as a fourth depth d4, is greater than the third depth d3 (See FIG. 11) and less than the first depth d1. The fourth depth d4 may be from about 300 nm to about 2,000 nm, and typically from about 600 nm to about 2,000 nm, although lesser and greater depths are also contemplated herein. The third doped well 70 has a different dopant concentration or a different doping conductivity type than and the first doped well 50. The third doped well 70 has a different dopant concentration or a different doping conductivity type than and the second doped well 60. The third doped well 70 has the same conductivity type as the second reachthrough 72.

Preferably, each of the third doped well 70, the second reachthrough 72, and the first doped well 50 has a doping of the first conductivity type, and each of the semiconductor region 10, the second doped well 60, and the first reachthrough 62 has a doping of the second conductivity type, which is the opposite of the first conductivity type. The dopant concentration of the third doped well 70 may be from about $1.0 \times 10^{16}/cm^3$ to about $5.0 \times 10^{20}/cm^3$, and typically from about $1.0 \times 10^{17}/cm^3$ to about $1.0 \times 10^{20}/cm^3$, although lesser and greater dopant concentrations are also explicitly contemplated herein. The dopant concentration of the second reachthrough 72 may be from about $1.0 \times 10^{19}/cm^3$ to about $5.0 \times 10^{20}/cm^3$, and typically from about $3.0 \times 10^{19}/cm^3$ to about $3.0 \times 10^{20}/cm^3$, although lesser and greater dopant concentrations are also explicitly contemplated herein.

A complementary doped well 51 having a doping of the second conductivity type 51 may be formed abutting the first doped well 50 to electrically isolate from the portion of the semiconductor region 10 located underneath the third doped well 70. The complementary doped well 51 may be biased to electrically isolate the first doped well from the portion of the semiconductor region 10 underneath the third doped well 70.

A fourth contact via 98 is formed in the MOL dielectric layer 90 to provide electrical contact to the second reachthrough 72, which extends from a top surface of the third doped well 70 to the top surface 13 of the semiconductor substrate 8.

The fifth exemplary semiconductor structure comprises a fifth exemplary varactor, which comprises the varactor inner electrode 40A, the first node dielectric 30A, the first doped well 50, the second doped well 60, the third doped well 70. Some of the at least one second contact via 94, the third contact via 96, and the fourth contact via 98 may, or may not, be electrically connected by a metal interconnect structure (not shown). The fifth exemplary varactor may operate as a two terminal device, a three terminal device, or a four terminal device in the same manner as the fourth exemplary varactor. The complementary doped well 51 may be employed to electrically isolate the first doped well from other terminals or doped wells.

Further embodiments of the present invention, in which four or more vertically stacked doped wells, each having a different dopant concentration or a different doping conductivity type than the rest of the doped wells and provided with a reachthrough comprising a doped semiconductor material having a doping of the same conductivity type as the doped well connected thereto, are employed are explicitly contemplated herein. Each of the four or more vertically stacked doped wells may vertically abut another doped well located above or beneath each of the doped well.

Figure 14:
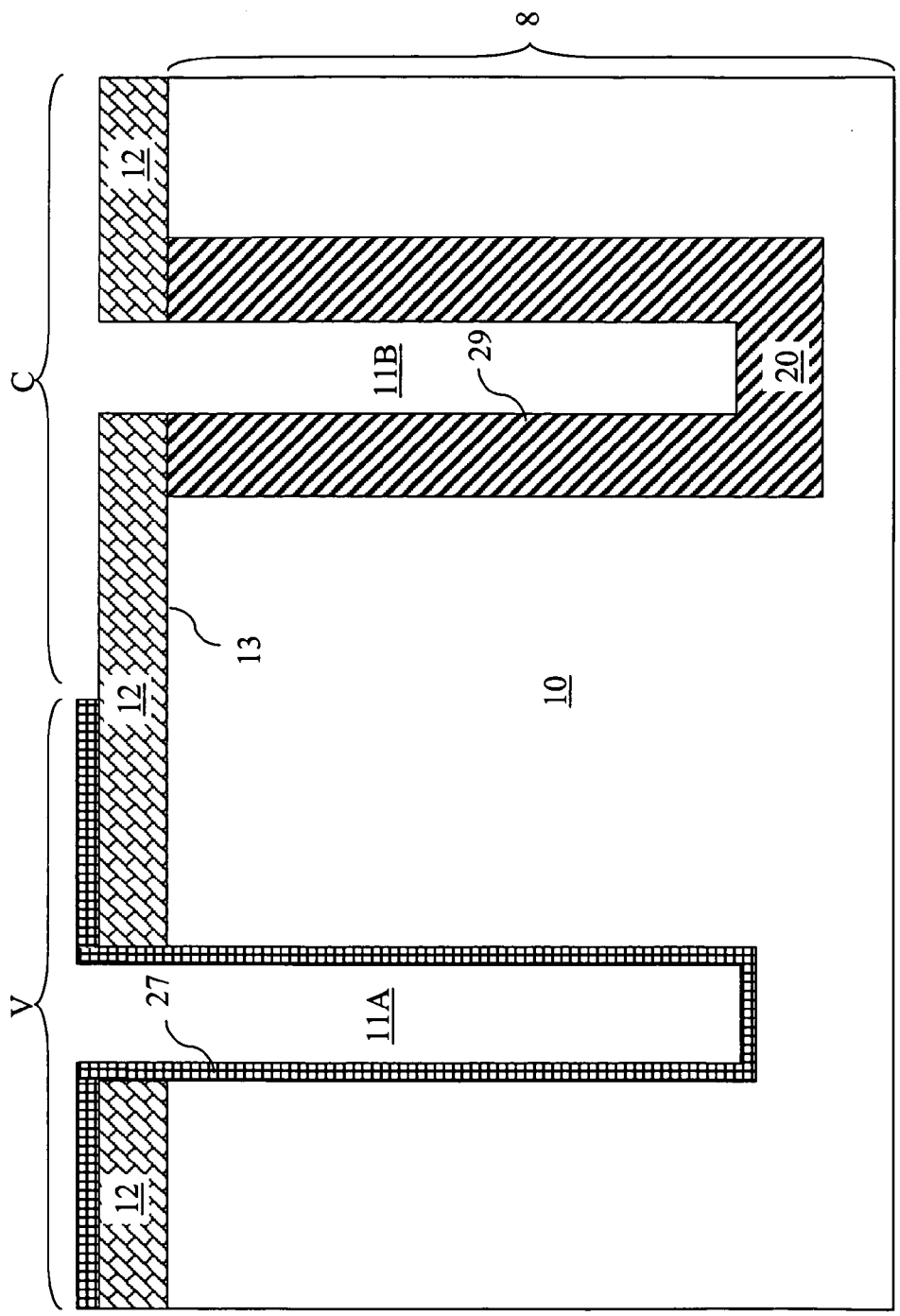
FIG. 14 is a vertical cross-sectional view of a sixth exemplary semiconductor structure according to a sixth embodiment of the present invention at a processing step corresponding to FIG. 3 of the first embodiment of the present invention.

Referring to FIG. 14, a sixth exemplary semiconductor structure according to a sixth embodiment of the present invention may be employed to form any of the first through fifth exemplary semiconductor structures described above at a manufacturing step corresponding to FIGS. 2 and 3. Specifically, a dopant masking layer 27 is deposited over sidewalls and bottom surfaces of the first and second deep trenches (11A, 11B) and the exposed surfaces of the at least one pad layer 12 in FIG. 1. The dopant masking layer 27 may comprise a dielectric material such as silicon nitride, a semiconductor material, or a metallic material. The dopant masking layer 27 may be formed, for example, by low pressure chemical vapor deposition (LPCVD) or rapid thermal chemical vapor deposition (RTCVD).

The dopant masking layer 27 is lithographically patterned so that the portion of the dopant masking layer 27 in the capacitor region C is removed, while the dopant masking layer 27 covers the varactor region V. Gas phase doping, plasma doping, ion implantation, or a combination thereof may be performed to form a buried plate on the sidewalls and the bottom surface of the second deep trench 11B, while preventing introduction of any dopant into the sidewalls and the bottom surface of the first deep trench 11A in the varactor region V. The dopant masking layer 27 is subsequently removed selective to the semiconductor region 10, the buried plate 20, and the at least one pad layer 12. Processing steps corresponding to FIG. 4 may be employed to form any of the first through fifth exemplary semiconductor structure described above.

While the varactors of the present invention may be operated as a three terminal device, a four terminal device, or a device with more than four terminals, the present invention is described herein for the case of operation of the exemplary varactors of the present invention as a two terminal device. It is explicitly contemplated herein, however, that the exemplary varactors of the present invention may be operated with more than two terminals to derive various beneficial device performance characteristics.

Figure 15:
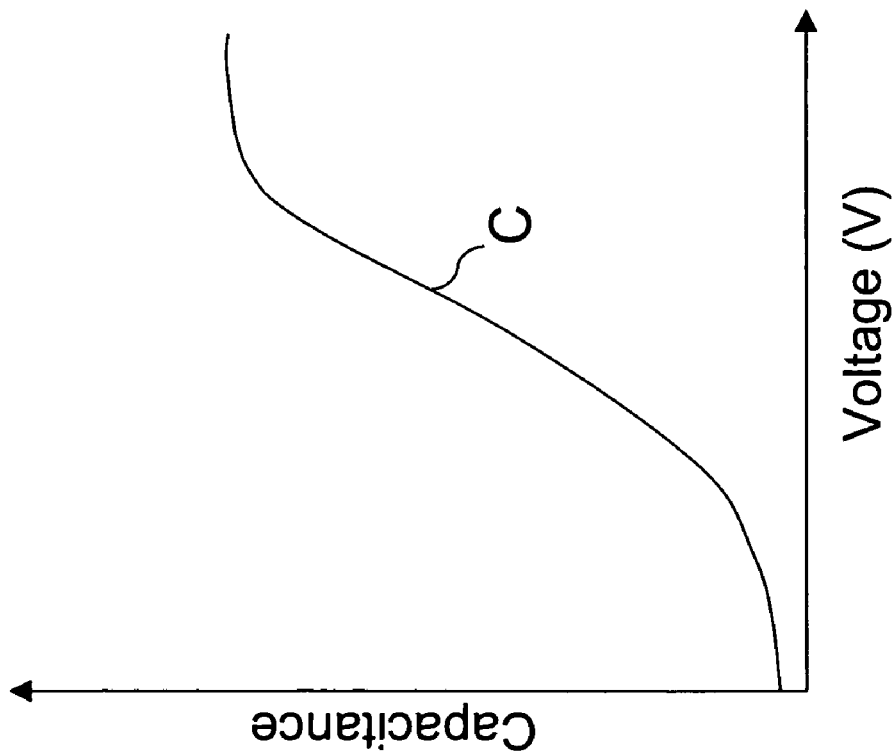
FIG. 15 is an exemplary voltage dependent capacitance curve for a varactor in the first exemplary semiconductor structure or in the second exemplary semiconductor structure.

Referring to FIG. 15, an exemplary voltage dependent capacitance curve C for the first exemplary varactor or the second exemplary varactor according to the first or second embodiment of the present invention is shown. At a low voltage, the portion of the first doped well 50 near the first node dielectric 30A (See FIGS. 7-10) is in depletion mode, thus providing a low capacitance. At a high voltage, the portion of the first doped well 50 near the first node dielectric 30A (See FIGS. 7-10) is driven into an accumulation mode, thus providing a high capacitance. By changing the dopant type of the first doped well 50, or the polarity of the voltage between the varactor inner electrode 40 and the first doped well 50, the exemplary voltage dependent capacitance curve C may be flipped so that the accumulation mode occurs at a low voltage and the depletion mode occurs at a high voltage.

Figure 16:
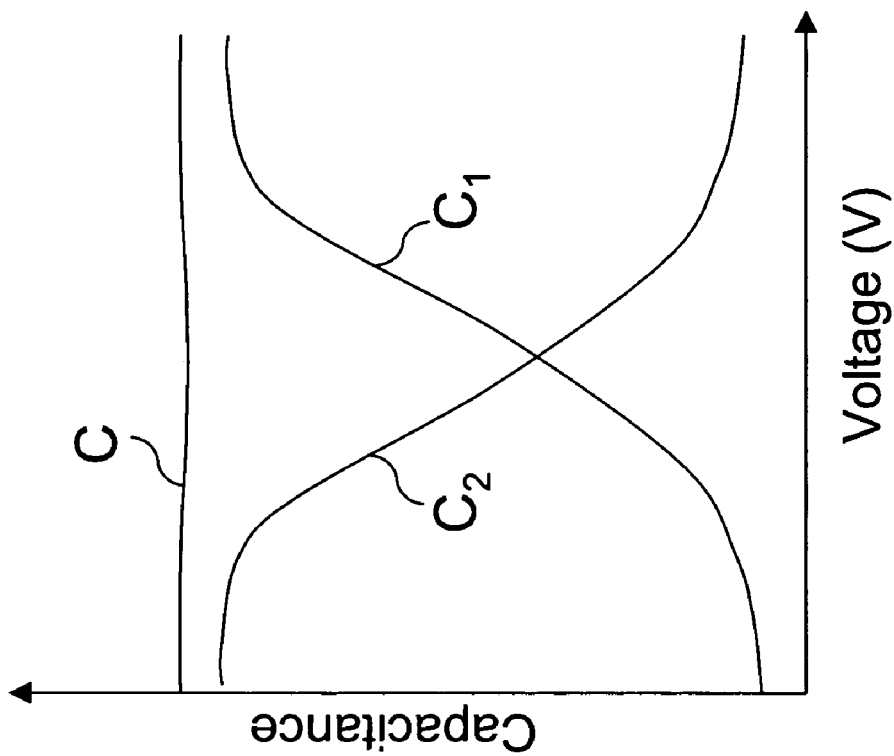
FIG. 16 is an exemplary voltage dependent capacitance curve for a varactor in the third exemplary semiconductor structure for a case in which a substantially constant capacitance is achieved for the varactor.

FIG. 16 is an exemplary voltage dependent capacitance curve C for the third exemplary varactor according to the third embodiment of the present invention. A first voltage dependent capacitance curve $C_1$, which is the component capacitance of the a first component capacitor between the varactor inner electrode 40A and the first doped well 50, shows low capacitance at a low voltage and high capacitance at a high voltage. A second voltage dependent capacitance curve $C_2$, which is the component capacitance of the a second component capacitor between the varactor inner electrode 40A and the second doped well 60, shows high capacitance at a low voltage and low capacitance at a high voltage. The exemplary voltage dependent capacitance curve C, which represents the total capacitance of the third exemplary varactor, is obtained by adding the first voltage dependent capacitance curve $C_1$ and second voltage dependent capacitance curve $C_2$. By optimizing the second depth d2 and the third depth d3 (See FIG. 11) as well as the dopant concentrations of the first doped well 50 and the second doped well 60, exemplary voltage dependent capacitance curve C may represent a substantially voltage independent capacitance, i.e., the third exemplary varactor may provide a substantially constant, voltage-independent capacitance.

Figure 17:
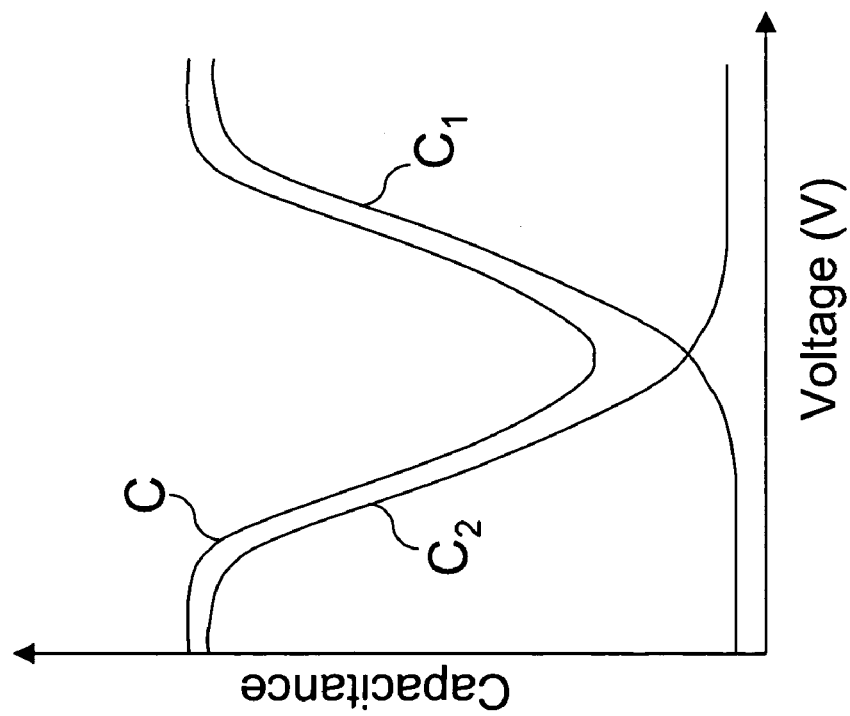
FIG. 17 is an exemplary voltage dependent capacitance curve for a varactor in the third exemplary semiconductor structure for a case in which a minimum capacitance is achieved within an operating range of voltage for the varactor.

FIG. 17 is another exemplary voltage dependent capacitance curve C for the third exemplary varactor according to the third embodiment of the present invention. A first voltage dependent capacitance curve $C_1$ shows low capacitance at a low voltage and high capacitance at a high voltage and a second voltage dependent capacitance curve $C_2$ shows high capacitance at a low voltage and low capacitance at a high voltage as in the previous example. However, the voltages at which the capacitance changes are separated by a voltage range. By optimizing the second depth d2 and the third depth d3 (See FIG. 11) as well as the dopant concentrations of the first doped well 50 and the second doped well 60, exemplary voltage dependent capacitance curve C may represent a substantially voltage dependant capacitance, i.e., the third exemplary varactor may provide a peak or a valley in the exemplary voltage dependent capacitance curve C as a function of voltage differential between the varactor inner electrode 40A and the first doped well 50 and the second doped well 60. The first doped well 50 and the second doped well 60 are at the same potential for the purposes of this application, which is effected by a metal interconnect structure that electrically shorts the at least one second contact via 94 and the third contact via 96. By manipulation of the profiles of the first voltage dependent capacitance curve $C_1$ and the second voltage dependent capacitance curve $C_2$, a maximum or a minimum in the total capacitance may be achieved in the exemplary voltage dependent capacitance curve C.

Figure 18:
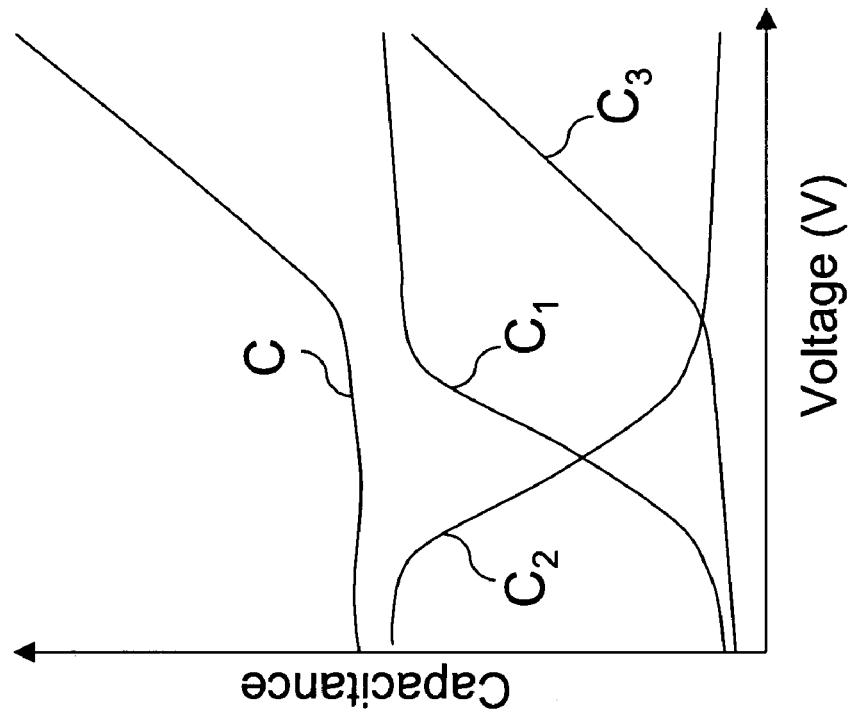
FIG. 18 is an exemplary voltage dependent capacitance curve for a varactor in the fourth or fifth exemplary semiconductor structure for a case in which the varactor has a complex voltage dependency.

FIG. 18 is an exemplary voltage dependent capacitance curve for the fourth exemplary varactor or the fifth exemplary varactor according to the fourth or fifth embodiment of the present invention. Each of the profiles of the first voltage dependent capacitance curve $C_1$ showing the first component capacitance between the varactor inner electrode 40A and the first doped well 50 (See FIGS. 12 and 13), the second voltage dependent capacitance curve $C_2$ showing the second component capacitance between the varactor inner electrode 40A and the second doped well 60, and the third voltage dependent capacitance curve $C_3$ showing the third component capacitance between the varactor inner electrode 40A and the third doped well 70 may be individually tailored by adjusting the second depth d2, the third depth d3, the fourth depth d4, the doping type and the dopant concentration of each of the first, second, and third doped wells (50, 60, 70). The exemplary voltage dependent capacitance curve C, which is obtained by adding the first through third voltage dependent capacitance curve ($C_1$, $C_2$, $C_3$) may have a complex functional dependency on the voltage bias across the first node dielectric 30A.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a deep trench located in a semiconductor substrate and having a bottom surface located at a first depth from a top surface of said semiconductor substrate;
   a node dielectric abutting sidewalls and said bottom surface of said deep trench;
   a conductive inner electrode located inside said node dielectric and contacting all inner surfaces of said node dielectric and not contacting any semiconductor material of said semiconductor substrate, wherein said deep trench is completely filled by said node dielectric and said conductive inner electrode, and said node dielectric is not present over said conductive inner electrode;
   a doped well extending from said top surface of said semiconductor substrate to a second depth, located outside said deep trench, and abutting and laterally enclosing said node dielectric, wherein said second depth is less than said first depth;
   a semiconductor region having a different dopant concentration or a doping of a different conductivity type than said doped well, located in said semiconductor substrate, and abutting and laterally enclosing an entirety of a lower portion of said deep trench beneath a depth from said top surface of said semiconductor substrate, wherein said depth is less than said first depth; and
   a contact via vertically abutting a top surface of said conductive inner electrode.

2. The semiconductor structure of claim 1, further comprising:
   a first contact via vertically abutting a top surface of said conductive inner electrode; and
   a second contact via vertically abutting said doped well.

3. The semiconductor structure of claim 1, further comprising a shallow trench isolation structure overlying said node dielectric and laterally abutting and laterally enclosing an entirety of an upper portion of said conductive inner electrode.

4. The semiconductor structure of claim 1, further comprising a shallow trench isolation structure surrounding said node dielectric, wherein said node dielectric abuts said top surface of said semiconductor substrate and said doped well laterally encloses an entirety of an upper portion of said conductive inner electrode.

5. The semiconductor structure of claim 1, wherein said semiconductor region abuts said doped well at a second depth.

6. The semiconductor structure of claim 1, further comprising a second doped well located in said semiconductor substrate and extending from said second depth to a third depth, wherein said second doped well is located outside said deep trench and abuts and laterally encloses said node dielectric, wherein said third depth is greater than said second depth and is less than said first depth.

7. The semiconductor structure of claim 5, wherein said semiconductor region has a doping of a first conductivity type and said doped well has a doping of a second conductivity type, wherein said second conductivity type is the opposite of said first conductivity type.

8. The semiconductor structure of claim 6, wherein said second doped well and said doped well have different dopant concentrations or different doping conductivity types.

9. The semiconductor structure of claim 6, wherein said second doped well has a doping of a first conductivity type and said doped well has a doping of a second conductivity type, wherein said second conductivity type is the opposite of said first conductivity type.

10. The semiconductor structure of claim 6, wherein said contact via is a first contact via, and wherein said semiconductor structure further comprises:
    a second contact via vertically abutting said doped well;
    a conductive reachthrough region extending from said top surface of said semiconductor substrate to said second doped well; and
    a third contact via vertically abutting said conductive reachthrough region, wherein said third contact via and said second via are electrically shorted by a metal interconnect structure.

11. The semiconductor structure of claim 6, wherein said semiconductor region abuts said doped well at said third depth.

12. The semiconductor structure of claim 6, further comprising a third doped well located in said semiconductor substrate and extending from said third depth to a fourth depth, wherein said third doped well is located outside said deep trench and abuts and laterally encloses said node dielectric, wherein said fourth depth is greater than said third depth and is less than said first depth.

13. The semiconductor structure of claim 10, wherein said semiconductor region has a doping of a first conductivity type and said doped well has a doping of a second conductivity type, wherein said second conductivity type is the opposite of said first conductivity type.

14. The semiconductor structure of claim 12, wherein said third doped well has a different dopant concentration or a different doping conductivity type than said second doped well, and wherein third doped well has a different dopant concentration or a different doping conductivity type than said doped well.

15. The semiconductor structure of claim 12, further comprising:
    a first contact via vertically abutting a top surface of said conductive inner electrode;
    a second contact via vertically abutting said doped well;
    a conductive reachthrough region extending from said top surface of said semiconductor substrate to said second doped well;
    a third contact via vertically abutting said conductive reachthrough region;
    another conductive reachthrough region extending from said top surface of said semiconductor substrate to said third doped well; and
    a fourth contact via vertically abutting said another conductive reachthrough region, wherein said fourth contact via, said third contact via, and said second via are electrically shorted by a metal interconnect structure.

16. The semiconductor structure of claim 13, wherein said semiconductor region abuts said doped well at said fourth depth.

17. A semiconductor structure comprising:
a first deep trench located in a semiconductor substrate and having a bottom surface located at a first depth from a top surface of said semiconductor substrate;
a first node dielectric abutting sidewalls and said bottom surface of said first deep trench;
a first conductive inner electrode located inside said first node dielectric and contacting all inner surfaces of said first node dielectric and not contacting any semiconductor material of said semiconductor substrate, wherein said first deep trench is completely filled by said first node dielectric and said first conductive inner electrode, and said first node dielectric is not present over said first conductive inner electrode;
a doped well extending from said top surface of said semiconductor substrate to a second depth, located outside said first deep trench, and abutting and laterally enclosing said first node dielectric, wherein said second depth is less than said first depth;
a semiconductor region having a different dopant concentration or a doping of a different conductivity type than said doped well, located in said semiconductor substrate, and abutting and laterally enclosing an entirety of a lower portion of said first deep trench beneath a depth from said top surface of said semiconductor substrate, wherein said depth is less than said first depth;
a second deep trench located in said semiconductor substrate and having a bottom surface located at said first depth;
a second node dielectric abutting sidewalls and said bottom surface of said second deep trench;
a second conductive inner electrode located inside said second node dielectric;
a buried plate layer located underneath and outside said second node dielectric and laterally enclosing and laterally abutting said second node dielectric and abutting a bottom surface of said second node dielectric at said first depth; and
a contact via vertically abutting a top surface of said first conductive inner electrode.

18. The semiconductor structure of claim 17, further comprising another doped well disjoined from said doped well and abutting said buried plate layer.

19. The semiconductor structure of claim 17, wherein said semiconductor region has a doping of a first conductivity type and said buried plate layer has a doping of a second conductivity type, wherein said second conductivity type is the opposite of said first conductivity type.

20. The semiconductor structure of claim 18, wherein said contact via is a first contact via, and wherein said semiconductor structure further comprises a second contact via vertically abutting said another doped well.

21. A method of forming a semiconductor structure comprising:
providing a semiconductor substrate comprising a semiconductor region having a doping of a first conductivity type;
forming a deep trench extending from a top surface of said semiconductor substrate to a first depth in said semiconductor region;
forming a node dielectric on sidewalls and a bottom surface of said deep trench, wherein an entirety of surfaces of said deep trench has a doping of said first conductivity type;
forming a conductive inner electrode inside said node dielectric, wherein said conductive inner electrode contacts all inner surfaces of said node dielectric and does not contacting any semiconductor material of said semiconductor substrate, said deep trench is completely filled by said node dielectric and said conductive inner electrode, and said conductive inner electrode is not present over said top surface of said conductive inner electrode;
forming a doped well extending from said top surface of said semiconductor substrate to a second depth outside said deep trench by conversion of an upper portion of said semiconductor region through introduction of dopants into said upper portion of said semiconductor region, wherein said doped well abuts and laterally encloses said node dielectric, and wherein said second depth is less than said first depth; and
forming a contact via vertically contacting a top surface of said conductive inner electrode.

22. The method of claim 21, wherein a remaining portion of said semiconductor region after said forming of said doped well abuts and laterally encloses an entirety of a lower portion of said deep trench beneath a depth from said top surface of said semiconductor substrate, wherein said depth is less than said first depth.

23. The method of claim 21, wherein said semiconductor region extends from said top surface of said semiconductor substrate to said first depth prior to said forming of said deep trench, and wherein an entirety of said semiconductor region is single crystalline.

24. The method of claim 21, further comprising:
forming a first contact via directly on a top surface of said conductive inner electrode; and
forming a second contact via directly on said doped well.

25. The method of claim 21, further comprising forming a shallow trench isolation structure atop said node dielectric, wherein said shallow trench isolation structure laterally abuts and laterally encloses an entirety of an upper portion of said conductive inner electrode.

26. The method of claim 21, wherein said doped well has a doping of a second conductivity type, wherein said second conductivity type is the opposite of said first conductivity type.

27. A method of forming a semiconductor structure comprising:
providing a semiconductor substrate comprising a semiconductor region having a doping of a first conductivity type;
forming a first deep trench and a second deep trench, each extending from a top surface of said semiconductor substrate to a first depth in said semiconductor region;
forming a buried plate layer having a doping of a second conductivity type on sidewalls of said second deep trench, while an entirety of sidewalls of said first trench is protected from introduction of any dopants of said second conductivity type, wherein said second conductivity type is the opposite of said first conductivity type;
forming a first node dielectric on sidewalls and a bottom surface of said first deep trench, wherein an entirety of surfaces of said first deep trench has a doping of said first conductivity type;
forming a first conductive inner electrode inside said first node dielectric, wherein said first conductive inner electrode contacts all inner surfaces of said first node dielectric and does not contacting any semiconductor material of said semiconductor substrate, said first deep trench is completely filled by said first node dielectric and said first conductive inner electrode, and said first conductive inner electrode is not present over said top surface of said conductive inner electrode;

forming a doped well extending from said top surface of said semiconductor substrate to a second depth outside said first deep trench by conversion of an upper portion of said semiconductor region through introduction of dopants into said upper portion of said semiconductor region, wherein said doped well abuts and laterally encloses said first node dielectric, and wherein said second depth is less than said first depth; and forming a contact via vertically contacting a top surface of said first conductive inner electrode.

28. The method of claim 27, further comprising:

forming a second node dielectric on sidewalls and a bottom surface of said second deep trench, wherein at least a portion of surfaces of said second deep trench has a doping of said second conductivity type;

forming a second conductive inner electrode inside said second node dielectric; and forming another doped well extending from said top surface of said semiconductor substrate to said second depth outside said second deep trench by conversion of another upper portion of said semiconductor region through introduction of dopants into said another upper portion of said semiconductor region, wherein said another doped well abuts and laterally encloses said second node dielectric.

29. The method of claim 28, further comprising:

forming a first contact via directly on a top surface of said first conductive inner electrode;

forming a second contact via directly on said doped well;

forming a third contact via directly on a top surface of said second conductive inner electrode; and forming a fourth contact via directly on said another doped well.

* * * * *